United States Patent
Kang et al.

(10) Patent No.: US 11,908,503 B2
(45) Date of Patent: Feb. 20, 2024

(54) NONVOLATILE MEMORY DEVICES HAVING ENHANCED WRITE DRIVERS THEREIN

(71) Applicant: Samsung Electronics Co., Ltd., Suwon-si (KR)

(72) Inventors: Gyuseong Kang, Goyang-si (KR); Antonyan Artur, Suwon-si (KR); Hyuntaek Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 152 days.

(21) Appl. No.: 17/711,297

(22) Filed: Apr. 1, 2022

(65) Prior Publication Data

US 2023/0020262 A1 Jan. 19, 2023

(30) Foreign Application Priority Data

Jul. 16, 2021 (KR) .................... 10-2021-0093338

(51) Int. Cl.
| | | |
|---|---|---|
| *G11C 11/16* | (2006.01) | |
| *G11C 7/14* | (2006.01) | |
| *G11C 7/10* | (2006.01) | |

(52) U.S. Cl.
CPC ........ *G11C 11/1673* (2013.01); *G11C 7/1039* (2013.01); *G11C 7/14* (2013.01); *G11C 11/1655* (2013.01); *G11C 11/1675* (2013.01); *G11C 11/1697* (2013.01)

(58) Field of Classification Search
CPC ..... G11C 11/1673; G11C 7/1039; G11C 7/14; G11C 11/1655; G11C 11/1675
See application file for complete search history.

(56) References Cited

U.S. PATENT DOCUMENTS

| | | |
|---|---|---|
| 6,590,372 B1 | 7/2003 | Wiles |
| 7,236,045 B2 | 6/2007 | Tschanz et al. |
| 8,665,007 B2 | 3/2014 | Ochoa et al. |
| 9,542,989 B2 | 1/2017 | Gogl et al. |
| 10,483,023 B1 | 11/2019 | Itani |
| 10,692,575 B1 | 6/2020 | Huang |
| 10,930,346 B1 * | 2/2021 | Ryu .................. G11C 13/0069 |
| 11,309,007 B2 * | 4/2022 | Chang .................. G11C 16/10 |
| 2006/0152970 A1 | 7/2006 | Debrosse et al. |
| 2007/0098041 A1 | 5/2007 | Seo |
| 2010/0123514 A1 | 5/2010 | Le et al. |
| 2013/0015834 A1 | 1/2013 | Glibbery |
| 2014/0266119 A1 | 9/2014 | Burton et al. |

FOREIGN PATENT DOCUMENTS

KR 100652422 B1 12/2006

* cited by examiner

*Primary Examiner* — Han Yang
(74) *Attorney, Agent, or Firm* — Myers Bigel, P.A.

(57) ABSTRACT

A nonvolatile memory device includes an array of magnetic memory cells, and control logic circuit having a voltage generator therein, which is configured to generate a gate voltage. A row decoder is provided, which is connected by word lines to the array of magnetic memory cells, and has a word line driver driven therein, which is responsive to the gate voltage. A column decoder is provided, which is connected by bit lines and source lines to the array of magnetic memory cells. A write driver is provided, which has a write voltage generating circuit therein that is configured to output a write voltage, in response to: (i) a reference voltage generated using a replica magnetic memory cell, and (ii) a feedback voltage generated using a magnetic memory cell in which a write operation is to be performed.

20 Claims, 16 Drawing Sheets

NONVOLATILE MEMORY DEVICES HAVING ENHANCED WRITE DRIVERS THEREIN

REFERENCE TO PRIORITY APPLICATION

This application claims priority to Korean Patent Application No. 10-2021-0093338, filed Jul. 16, 2021, the disclosure of which is hereby incorporated herein by reference.

BACKGROUND

The present inventive concept relates to nonvolatile memory devices and methods of operating same.

Nonvolatile memory devices may store data in memory cells using write operations, yet typically do not require power to thereafter maintain the data stored in the memory cells. Memory devices may apply a write voltage and/or a write current of a specific level to the memory cells to perform a write operation. In addition, next-generation memory devices, which are nonvolatile and do not require refreshing, have been researched in accordance with demand for semiconductor memory devices having higher capacity and lower power consumption. In particular, in the case of a magnetic random access memory (MRAM) using a ferromagnetic material, a material constituting a memory cell has a resistance that varies according to a state in which a current or voltage is applied, and data may be stored in the memory cells using the varied resistance. However, during a write operation for storing data, an excessive current and/or voltage may be applied to the memory cell, so that deterioration of the memory cell may be accelerated and it may be difficult to stably control the applied current and/or voltage during a lifespan of the memory cells within the MRAM.

SUMMARY

An aspect of the present inventive concept is to provide a nonvolatile memory device having improved performance using a write voltage generating circuit, which is capable of stably adjusting a write voltage applied to a magnetic memory cell and a write driver including the same.

According to an aspect of the present inventive concept, a nonvolatile memory device may include a memory cell array including magnetic memory cells, and a control logic circuit, which includes a voltage generator generating a gate voltage. A row decoder is provided, which includes a word line driver driven by the gate voltage, and is connected to the memory cell array through word lines. A column decoder is provided, which is connected to the memory cell array through bit lines and source lines. A write driver is provided, which includes a write voltage generating circuit that receives a reference voltage generated using a replica magnetic memory cell and a feedback voltage generated using the magnetic memory cell in which a write operation is performed, and outputs a write voltage. In some embodiments, the write voltage generating circuit includes a voltage divider adjusting a size of the feedback voltage with a level switch, and the write driver transfers the write voltage to a bit line selected by the column decoder during the write operation.

According to another aspect of the present inventive concept, a nonvolatile memory device includes a memory cell array including magnetic memory cells, and a control logic circuit, which includes a voltage generator for: generating a gate voltage, determining data stored in the magnetic memory cells, on which a write operation is to be performed (before the write operation), and performing the write operation when the data stored in each of the magnetic memory cells is different from data to be written to the magnetic memory cell in the write operation. A row decoder is provided, which includes a word line driver driven by the gate voltage, and connected to the memory cell array through word lines. A column decoder is provided, which is connected to the memory cell array through bit lines and source lines. A write driver is provided, which includes a write voltage generating circuit, and transmits a write voltage to a bit line selected by the column decoder when performing a write operation. The write voltage generating circuit generates the write voltage based on a reference voltage generated using a replica magnetic memory cell and a feedback voltage generated using a magnetic memory cell in which the write operation is performed.

According to another aspect of the present inventive concept, a nonvolatile memory device includes a memory cell array including magnetic memory cells divided into a plurality of memory cell groups, and a control logic circuit, which includes a voltage generator for generating a gate voltage. A row decoder is provided, which includes a word line driver driven by the gate voltage, and is connected to the memory cell array through word lines. A column decoder is provided, which is connected to the memory cell array through bit lines and source lines. A write driver is provided, which includes a write voltage generating circuit for: (i) outputting a write voltage that is proportional to a reference voltage generated using a replica magnetic memory cell based on the reference voltage and a compensation voltage generated using a compensation circuit, which operates as a source follower and includes a PMOS transistor, and (ii) transmitting the write voltage to a bit line selected by the column decoder when performing a write operation.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
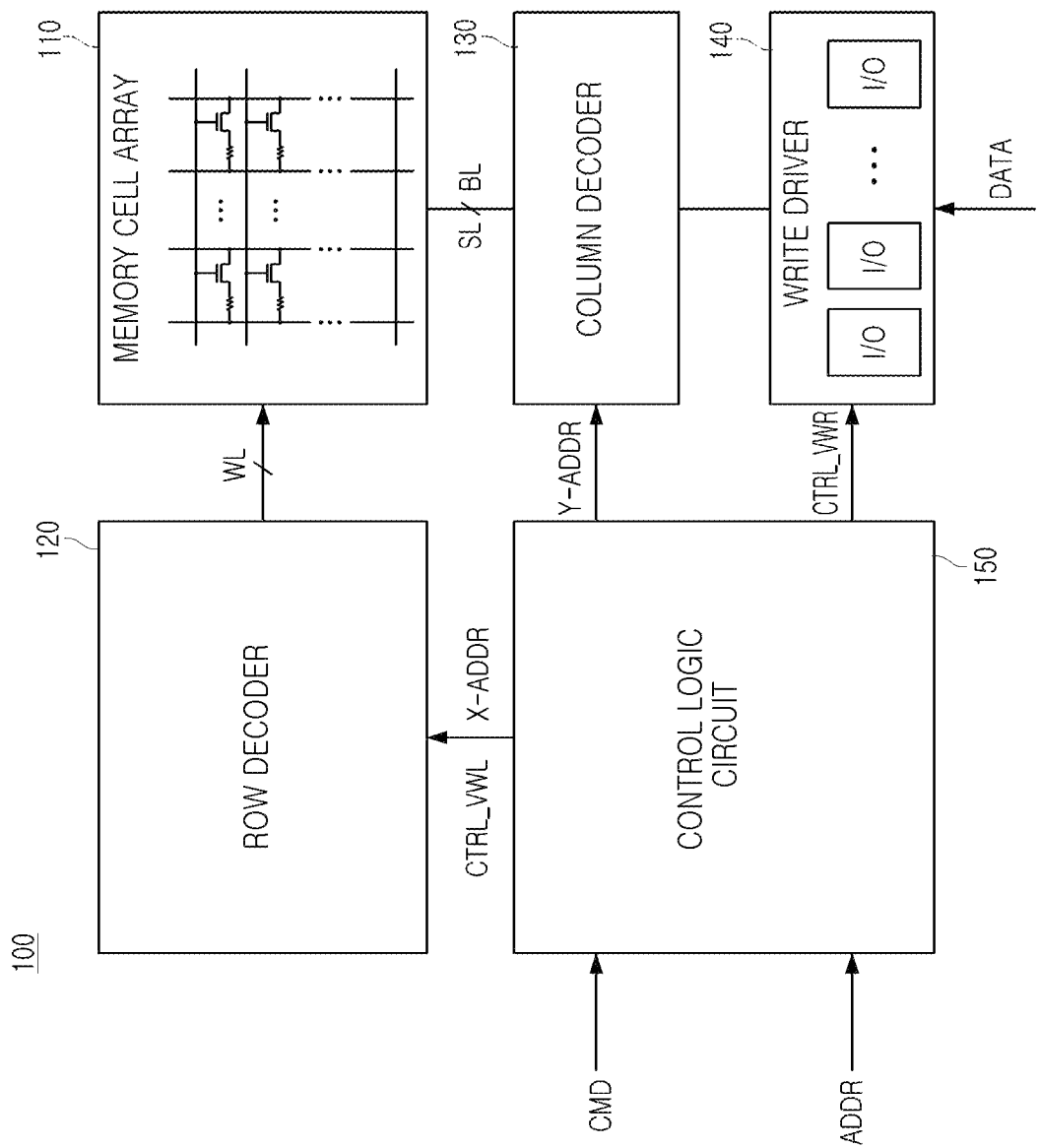
FIG. 1 is a block diagram illustrating a nonvolatile memory device according to an embodiment of the present inventive concept.

FIG. 1 is a block diagram illustrating a nonvolatile memory device according to an embodiment of the present inventive concept. Referring to FIG. 1, a memory device 100 may include a memory cell array 110, a row decoder 120, a column decoder 130, a write driver 140, and a control logic circuit 150. Although not illustrated in FIG. 1, the memory device 100 may further include a memory interface circuit and may further include a sense amplifier circuit connected to a bit line and a source line.

The memory cell array 110 may include a plurality of nonvolatile memory cells for storing data. In an example, the memory cell array 110 may include memory cells used in a nonvolatile memory device such as flash memory cells, phase change random access memory (PRAM) cells, ferroelectric random access memory (FRAM) cells, and resistance random access memory (RRAM) cells. In the present disclosure, the memory device 100 may be a magnetic random access memory (MRAM) device, and in particular, the memory cell array 110 may include a spin transfer torque magneto resistive random access memory (STT-MRAM) cells. However, this is only an example embodiment and the memory cell array 110 is not limited thereto, and the technical spirit of the present inventive concept may be applied to other nonvolatile memory devices and volatile memory devices. For example, the memory cell array 110 may include a plurality of memory cells MC respectively disposed at intersections of a plurality of word lines WL and a plurality of bit lines BL. For example, each of the plurality of memory cells MC may include a magnetic tunnel junction (MTJ) having a magnetic material and a switching element. In the present disclosure, each of the plurality of memory cells MC may be defined as a magnetic memory cell.

The row decoder 120 may be connected to the memory cell array 110 through word lines WL. The row decoder 120 may control a voltage applied to the word lines WL under the control of the control logic 150. For example, upon receiving a row address X-ADDR, the row decoder 120 may select one of the plurality of word lines WL and apply a selection voltage for reading or writing. The row decoder 120 may apply a non-selection voltage to other unselected word lines.

The column decoder 130 may be connected to the source lines SL and the bit lines BL in the memory cell array 110. Upon receiving a column address Y-ADDR, the column decoder 130 may select bit lines BL and/or source lines SL corresponding to memory cells to be operated. The column decoder 130 may be connected to the write driver 140. During a write operation, the column decoder 130 may electrically connect selected bit lines BL to the write driver 140. Furthermore, during a read operation, the column decoder 130 may connect selected bit lines BL to the sense amplifier circuit (not shown).

The write driver 140 may be driven under the control of the control logic circuit 150. For example, the write driver 140 may perform a write operation of inputting data into memory cells connected to bit lines BL selected by the column decoder 130 and word lines WL selected by the row decoder 120. The write driver 140 may generate a current or a voltage according to data input from a data input/output circuit I/O and output the generated current or voltage to the selected bit lines BL. In the nonvolatile memory device 100 illustrated in FIG. 1, the data input/output circuit I/O is illustrated as being included in the write driver 140, but this is only an example for convenience of description and may not be limited. For example, the data input/output circuit I/O may be defined as an extra circuit separate from the write driver 140.

The control logic circuit 150 may control various operations in the memory device 100 as a whole. The control logic circuit 150 may receive a command CMD and/or an address ADDR from a memory interface circuit and output various control signals. For example, the control logic circuit 150 may output a voltage control signal, a row address X-ADDR, and a column address Y-ADDR.

Also, the control logic circuit 150 may provide a write enable signal and an inverted write enable signal to the write driver 140. The write enable signal and the inverted write enable signal may be complementary signals, but may not be limited thereto. When performing a write operation, the control logic circuit 150 may control the write enable signal to have a high level and control the inverted write enable signal to have a low level.

Referring to FIG. 1, the control logic circuit 150 according to an embodiment of the present inventive concept may include a voltage generator generating a gate voltage, and the write driver 140 may include a write voltage generating circuit generating a write voltage. However, this is merely an example and may not be limited to the illustrated ones. For example, based on a voltage control signal output from the control logic circuit 150, the voltage generator may generate a gate voltage applied to the word line and the write voltage generating circuit may generate a write voltage for performing a write operation.

A voltage generator included in the control logic circuit 150 may generate a gate voltage. The gate voltage may be applied to a word line driver included in the row decoder 120 to drive the row decoder 120. Also, the gate voltage may be applied to the write driver 140 to drive the write driver 140. However, in the nonvolatile memory device 100 according to an embodiment of the present inventive concept, the write driver 140 may output a compensated write voltage to perform a write operation.

Figure 2:
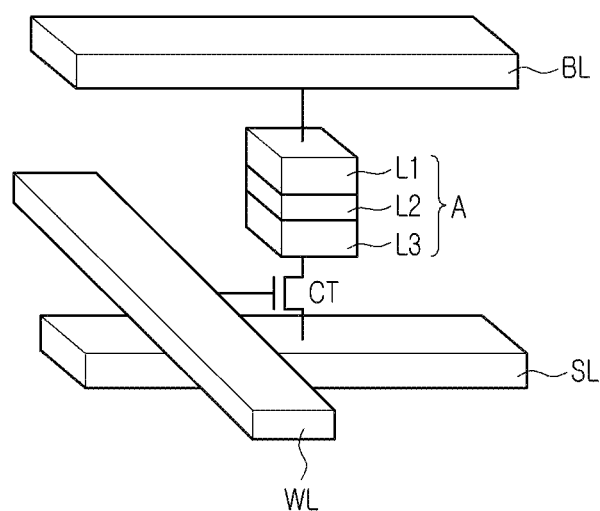
FIG. 2 is a perspective view illustrating a magnetic memory cell included in a nonvolatile memory device according to an embodiment of the present inventive concept.

FIG. 2 is a view illustrating a magnetic memory cell included in a nonvolatile memory device according to an embodiment of the present inventive concept. Referring to FIG. 2, the magnetic memory cell MC may include a magnetic tunnel junction (MTJ) device A and a cell transistor CT. A gate electrode of the cell transistor CT may be connected to the word line WL. One electrode of the cell transistor CT may be connected to the bit line BL through the MTJ device A, and the other electrode of the cell transistor CT may be connected to the source line SL.

The MTJ device A may include a sequentially stacked pinned layer L3, a tunnel layer L2, and a free layer L1. A magnetization direction of the pinned layer L3 may be fixed, and a magnetization direction of the free layer L1 may be the same as or opposite to the magnetization direction of the pinned layer L3. However, the structure of the magnetic memory cell MC illustrated in FIG. 2 is only an example embodiment and the present disclosure may not be limited thereto. For example, the MTJ device A may further include an antiferromagnetic layer for fixing the magnetization direction of the pinned layer (L3).

As will be understood by those skilled in the art, the free layer L1 may include a material capable of changing a magnetization direction by an electrical and/or magnetic factor provided outside and/or inside the magnetic memory cell MC. In addition, the tunnel layer L2 may have a thickness smaller than a spin diffusion length and may include a non-magnetic material. The pinned layer L3 may include a ferromagnetic material having a fixed magnetization direction.

Data stored in the magnetic memory cell MC may correspond to a resistance of the MTJ device A, and the resistance of MTJ "A" may vary depending on the magnetization direction of the free layer L1. For example, when the free layer L1 in the MTJ device A is magnetized in the same direction as the magnetization direction of the pinned layer L3, the MTJ device A may have low resistance, and in this case, the magnetic memory cell MC including the MTJ device A may be defined as storing data '0'. However, when the free layer L1 is magnetized in a direction opposite to the magnetization direction of the pinned layer L3, the MTJ device A may have high resistance, and in this case, the magnetic memory cell MC including the MTJ device A may be defined as storing data '1'. In other words, the nonvolatile memory device according to an embodiment of the present inventive concept may perform a write operation for storing data in the magnetic memory cell MC by changing the magnetization direction of the free layer L1 included in the MTJ device A.

For example, when a write voltage is applied to the source line SL and a low voltage, for example, a ground voltage, is applied to the bit line BL, a current may flow from the source line SL to the bit line BL. In this case, the magnetization direction of the free layer L1 may be the same as that of the pinned layer L3, the MTJ device A may have low resistance, and at this time, data '0' may be stored in the magnetic memory cell MC. However, when a write voltage is applied to the bit line BL and a low voltage, for example, a ground voltage, is applied to the source line SL, a current may flow from the bit line BL to the source line SL. In this case, the magnetization direction of the free layer L1 may be opposite to that of the pinned layer L3, MTJ device A may have high resistance, and at this time, data '1' may be stored in the magnetic memory cell MC.

Figure 3:
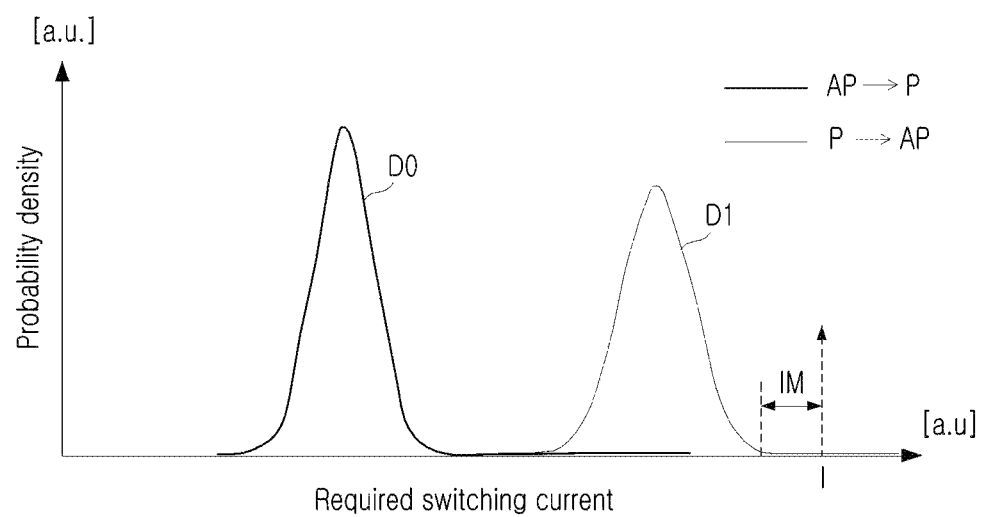
FIG. 3 is a graph illustrating switching current profiles associated with a write operation of a nonvolatile memory device.

FIG. 3 is a view illustrating a write operation of a nonvolatile memory device. In particular, FIG. 3 may be a view illustrating a write current required to perform a write operation of inputting data into magnetic memory cells included in a nonvolatile memory device and (characteristic) distribution of magnetic memory cells.

In a general nonvolatile memory device, during a write operation, a write driver may receive a gate voltage, a write enable signal, and an inverted write enable signal from the control logic circuit. The write driver may output a write voltage in response to the gate voltage, the write enable signal, and the inverted write enable signal. In particular, the write driver may transfer the write voltage to selected bit lines or selected source lines. For example, when performing a write operation of switching a state of the magnetic memory cells from a first state P having low resistance to a second state AP having high resistance, the write driver may transmit the write voltage to the selected bit lines. Conversely, even when performing a write operation of switching the state of the magnetic memory cells from the second state AP having high resistance to the first state P having low resistance, the write driver may transmit the write voltage to selected source lines. In addition, in order to perform a write operation in the magnetic memory device using the MTJ device, a bit line and a source line may be connected to each other through a memory cell by enabling a specific word line. By connecting the bit line and the source line, a write current may be generated in the magnetic memory cell, and data may be written in the magnetic memory cell using the write current.

Referring to FIG. 3, strength of the write current required to write data to the magnetic memory cell may vary depending on the write data. Also, even when writing the same write data, a magnitude of the write current required for the write operation may be different according to the distribution of the magnetic memory cells. For example, in order to perform a write operation of switching the state of the magnetic memory cells from the second state AP having high resistance to the first state P having low resistance, the magnetic memory cells may require a write signal having a certain magnitude according to a distribution D0 of the magnetic memory cells. Moreover, in order to perform a write operation to switch the state of the magnetic memory cells from the first state P having low resistance to the second state AP having high resistance, a write current having a predetermined magnitude or greater may be required in the magnetic memory cells according to a distribution D1 of the magnetic memory cells.

According to a difference in the distribution of the magnetic memory cells in each state, the magnitude of a write current required to perform a write operation to switch the state of the magnetic memory cells from the second state AP to the first state P may be smaller than the magnitude of the write current required to perform the write operation to switch from the first state P to the second state AP.

In a general nonvolatile memory device, when performing a write operation, the write voltage generating circuit may output the same write voltage regardless of write data. Accordingly, a predetermined write current I for performing a write operation may be generated in the magnetic memory cells regardless of write data to be written to the magnetic memory cells. For example, the predetermined write current I may be greater than a write current actually required for a write operation by a margin current IM to prevent failure of a write operation.

However, if the margin current IM is larger than necessary when the distribution of the magnetic memory cells is considered and in the case of performing a write operation to switch the state of the magnetic memory cells from the second state AP to the first state P, the predetermined write current I applied as a write current may be unnecessarily larger than the write current actually required. Thus, the predetermined write current I may unnecessarily increase energy consumed in a write operation in the nonvolatile memory device and may cause unnecessary stress in the magnetic memory cell, thereby reducing the lifespan of the nonvolatile memory device.

Figure 4:
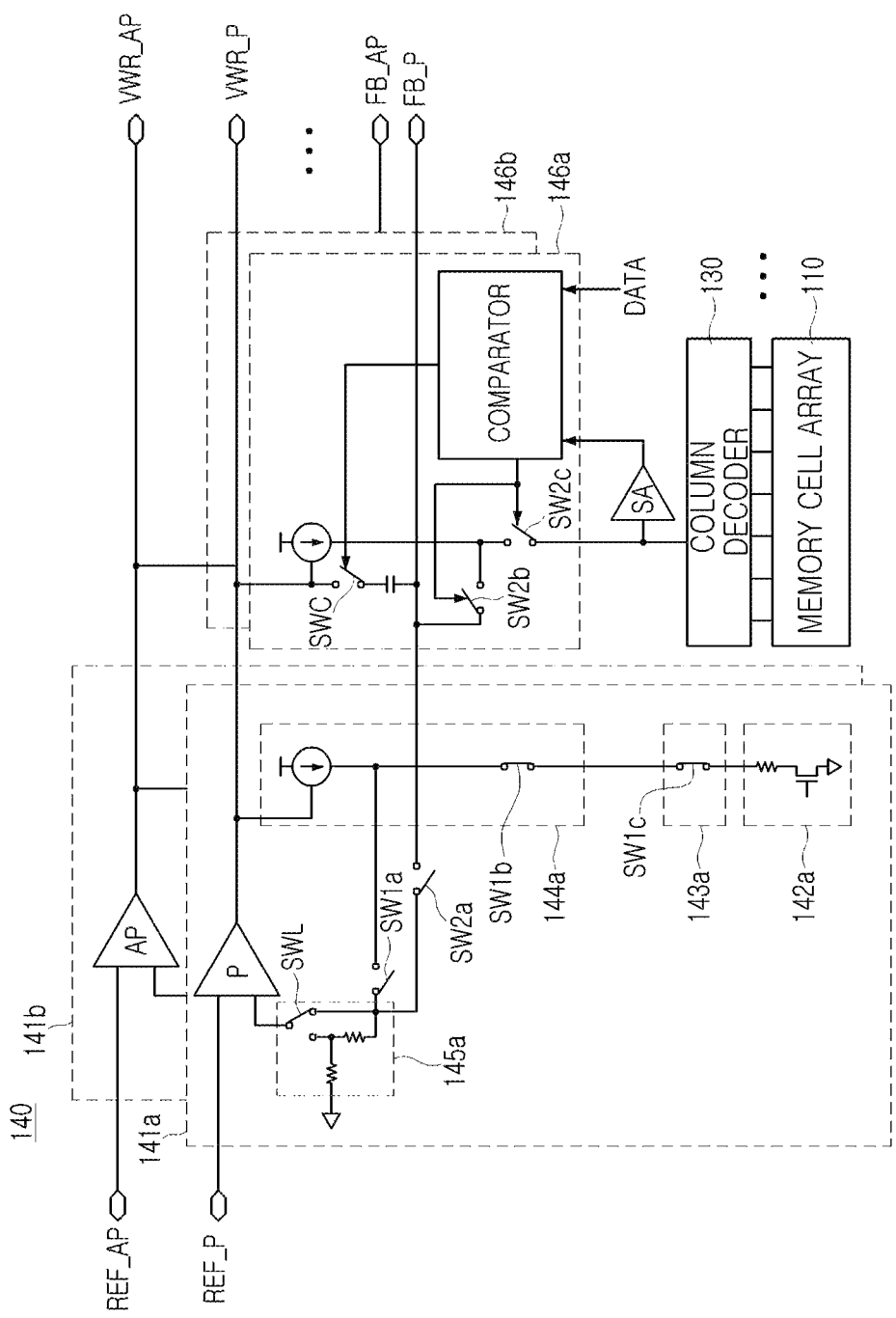
FIG. 4 is an electrical circuit schematic illustrating a write driver of a nonvolatile memory device according to an embodiment of the present inventive concept.

FIG. 4 is a circuit diagram illustrating a write driver of a nonvolatile memory device according to an embodiment of the present inventive concept. Referring to FIG. 4, the nonvolatile memory device 100 according to an embodiment of the present inventive concept may generate a write current having an appropriate strength in the magnetic memory cells when a write operation is performed, in order to solve the above described problem. Since the write current is determined based on a voltage applied to the magnetic memory cells and resistance of the magnetic memory cells, the nonvolatile memory device 100 may preferably generate a write current having an appropriate strength by dynamically adjusting the write voltage based on the resistance of the magnetic memory cells.

The nonvolatile memory device 100 according to an embodiment of the present inventive concept may correspond to the nonvolatile memory device 100 illustrated in FIG. 1. The nonvolatile memory device 100 may include the write driver 140 performing a write operation to transmit a write voltage to a bit line BL selected by the column decoder 130 and write data to the magnetic memory cells included in the memory cell array 110. The write driver 140 may include write voltage generating circuits 141a and 141b outputting write voltages VWR_P and VWR_AP to perform a write operation and selection circuits 146a and 146b selectively recording data DATA received from an external source through an input/output circuit in the magnetic memory cells. For example, in the nonvolatile memory device 100 according to an embodiment of the present inventive concept, the write driver 140 may be a PMOS driver using a PMOS transistor.

In the nonvolatile memory device 100 according to an embodiment of the present inventive concept, the magnetic memory cells may be divided into a plurality of memory cell groups. For example, one memory cell group may include 64 magnetic memory cells. However, this is only an example embodiment and is not limited thereto. One memory cell group may include a plurality of magnetic memory cells.

Bit lines and source lines connected to magnetic memory cells included in each of the plurality of memory cell groups may be connected to the column decoder 130. The column decoder 130 may be connected to the write driver 140 and the sense amplifier circuit SA. The write driver 140 connected to each of the plurality of memory cell groups may include two write drivers selectively driven according to a resistance corresponding to data to be written to a magnetic memory cell by a write operation.

In other words, any one of the plurality of memory cell groups may be electrically connected to two write drivers respectively corresponding to the first state P and the second state AP, and during a write operation, the two write drivers may receive data DATA through an input/output circuit corresponding to the memory cell group. Any one of the two write drivers may be activated according to the received data DATA, and the activated write driver may perform a write operation of writing data DATA to the magnetic memory cells.

As an example, the first write drivers 141a and 146a may be write drivers for performing a write operation to switch the state of the magnetic memory cells from the second state AP to the first state P. The first write drivers 141a and 146a may receive a first reference voltage REF_P and a first feedback voltage FB_P and may output a first write voltage VWR_P. In contrast, the second write drivers 141b and 146b may be write drivers for performing a write operation to thereby switch the state of the magnetic memory cells from the first state P to the second state AP. The second write drivers 141b and 146b may receive a second reference voltage REF_AP and a second feedback voltage FB_AP and may output a second write voltage VWR_AP. In some embodiments, a configuration of the first write drivers 141a and 146a may correspond to a configuration of the second write drivers 141b and 146b. Hereinafter, for convenience, in the present disclosure, the configuration of the first write drivers 141a and 146a is mainly described.

In the nonvolatile memory device 100 according to an embodiment of the present inventive concept, the first write drivers 141a and 146a may include a write voltage generating circuit 141a and a selection circuit 146a. The write voltage generating circuit 141a may include a replica magnetic memory cell 142a, a replica column decoder 143a, and a replica write driver 144a. The write voltage generating circuit 141a may output a first write voltage VWR_P based on a first reference voltage REF_P generated using the replica magnetic memory cell 142a and a first feedback voltage FB_P generated using a magnetic memory cell in which a write operation is performed.

In the nonvolatile memory device 100 according to an embodiment of the present inventive concept, the write voltage generating circuit 141a may further include a voltage divider 145a for adjusting a magnitude of the feedback voltage FB_P. The voltage divider 145a may be controlled with a level switch SWL. A first switch group SW1a, SW1b, and SW1c including a plurality of switches may be connected between the voltage divider 145a and the replica magnetic memory cell 142a. The plurality of switches included in the first switch group SW1a, SW1b, and SW1c may be disposed on a path through which the first reference voltage REF_P, which is generated using the replica magnetic memory cell 142a, is transmitted.

For example, each of the plurality of switches included in the first switch group SW1a, SW1b, SW1c may be disposed between the replica magnetic memory cell 142a, the replica column decoder 143a, the replica write driver 144a, and a voltage divider 145a. However, the number and arrangement of the first switch groups SW1a, SW1b, and SW1c illustrated in FIG. 4 are merely exemplary and may not be limited thereto.

The selection circuit 146a may be configured to compare data stored in the magnetic memory cell with incoming write data during a write operation and perform a write operation only on a magnetic memory cell requiring the write operation. For example, if data stored in the magnetic memory cell is the same as data to be written to the magnetic memory cell according to the write operation, the selection circuit 146a may stop the write operation as being unnecessary. But, if the data stored in the magnetic memory cell is different from the data to be written to the magnetic memory cell according to the write operation, the selection circuit 146a may control the write driver 140 to perform the necessary write operation to change the stored data.

The selection circuit 146a may include a compensation switch SWC to stably transmit a write voltage for magnetic memory cells in which a write operation is not performed. For example, the compensation switch SWC may be connected between a node to which the first feedback voltage FB_P is transmitted and a node to which the first write voltage VWR_P is transmitted together with the compensation capacitor.

A second switch group SW2a, SW2b, and SW2c including a plurality of switches may be connected between the voltage divider 145a and the magnetic memory cells. The plurality of switches included in the second switch group SW2a, SW2b, and SW2c may be disposed on a path through which the first feedback voltage FB_P generated using the magnetic memory cell on which the write operation is performed is transmitted. However, the number and arrangement of the second switch groups SW2a, SW2b, and SW2c illustrated in FIG. 4 are merely exemplary and may not be limited to the illustrated examples.

The nonvolatile memory device 100 according to an embodiment of the present inventive concept may selectively perform a write operation on the magnetic memory cells using the write voltage generating circuit 141a and the selection circuit 146a included in the write driver 140. The nonvolatile memory device 100 may precisely adjust the output write voltage by selectively feeding back the write voltage only to the write driver performing the write operation.

Figure 5:
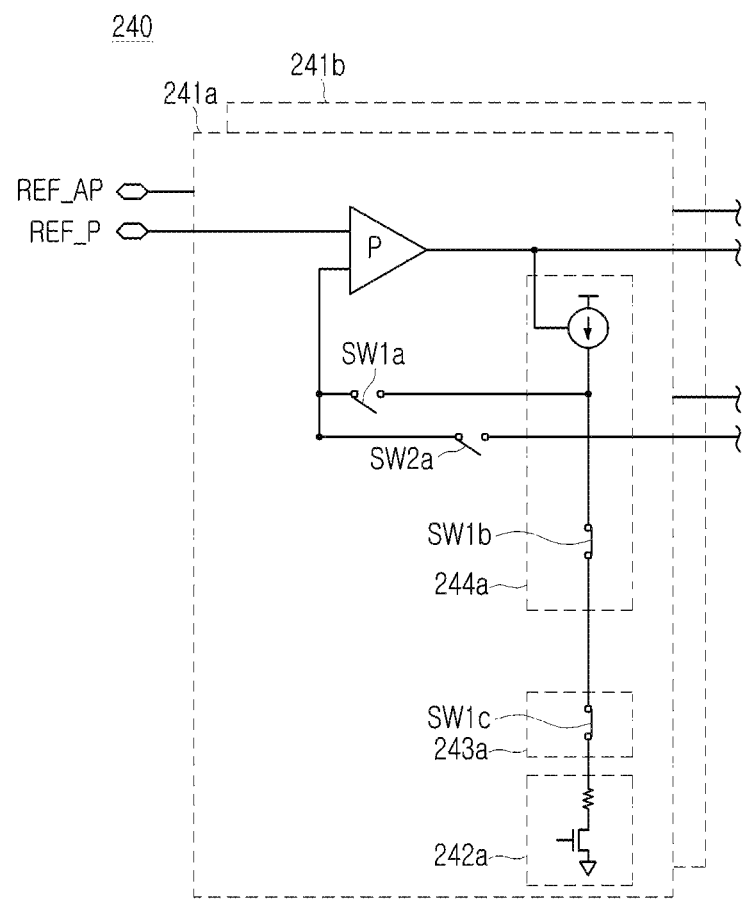
FIGS. 5 and 6 are electrical circuit diagrams illustrating a write voltage generating circuit of a nonvolatile memory device according to an embodiment of the present inventive concept.
Figure 6:
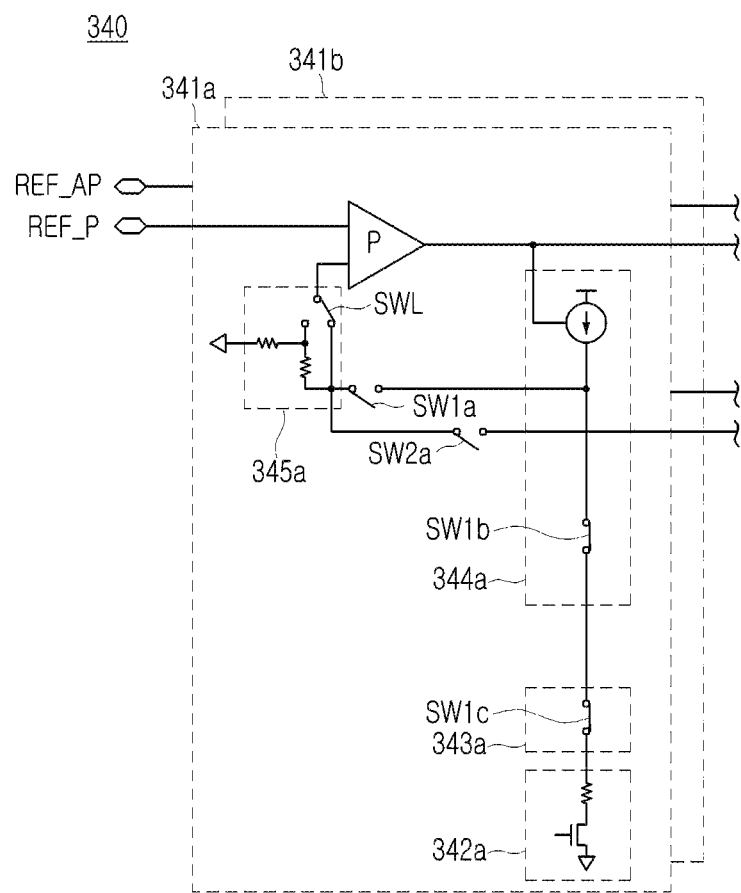

FIGS. 5 and 6 are circuit diagrams illustrating a write voltage generating circuit of a nonvolatile memory device according to an embodiment of the present inventive concept. FIG. 5 may be a view illustrating a write driver 240 of a nonvolatile memory device without a voltage divider for adjusting a feedback voltage, and FIG. 6 may be a view illustrating a writer driver 340 of a nonvolatile memory device including a voltage divider 345a for adjusting a feedback voltage. In particular, FIGS. 5 and 6 may be circuit diagrams of write voltage generating circuits 241a, 241b, 341a, and 341b included in the write drivers 240 and 340.

Referring to FIGS. 5 and 6, the write drivers 240 and 340 included in the nonvolatile memory device according to embodiments of the present inventive concept may correspond to the write driver 140 of the nonvolatile memory device 100 illustrated in FIG. 4. For example, the write drivers 240 and 340 may include a first write driver and a second write driver selectively driven according to a resistance corresponding to data DATA to be written to a magnetic memory cell according to a write operation.

A first write driver performing a write operation to switch the state of the magnetic memory cells from the second state AP to the first state P and a second write driver performing a write operation to switch the state of the magnetic memory cells from the first state P to the second state AP may include write voltage generating circuits 241a, 241b, 341a, and 342b, respectively.

The write voltage generating circuits 241a and 341a included in the first write driver of the nonvolatile memory device according to the example embodiments of the present inventive concept may include replica magnetic memory cells 242a and 342a, replica column decoder 243a and 343a, and replica write drivers 244a and 344a, respectively. The write voltage generating circuits 241a and 341a may output a first write voltage VWR_P based on a first reference voltage REF_P generated using the replica magnetic memory cells 242a and 342a and a first feedback voltage FB_P generated using a magnetic memory cell in which a write operation is performed. When dispersion occurs in the magnetic memory cells during a write operation, the write voltage generating circuits 241a and 341a may adjust the write voltage by outputting the first write voltage VWR_P reflecting the first feedback voltage FB_P.

The nonvolatile memory device according to an embodiment of the present inventive concept may compensate for the write voltage using the feedback voltage FB_P. For example, when the level switch SWL is turned on, the magnitude of the feedback voltage FB_P may be reduced by resistors included in the voltage divider 345a. The write voltage generating circuit 341a may be controlled to operate within a stable voltage range using the voltage divider 345a.

Figure 7:
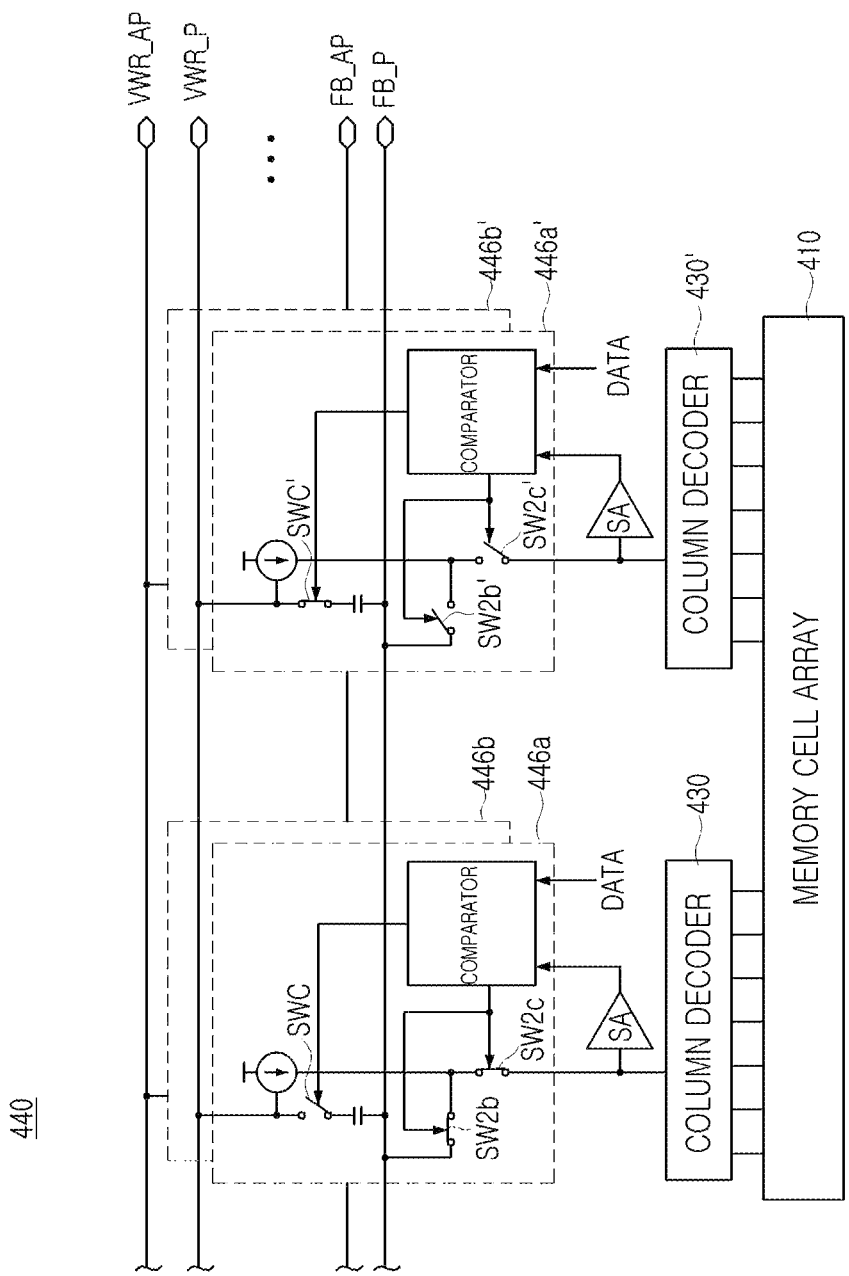
FIG. 7 is an electrical circuit diagram illustrating a write driver of a nonvolatile memory device according to an embodiment of the present inventive concept.

FIG. 7 is a circuit diagram illustrating a write driver of a nonvolatile memory device according to an embodiment of the present inventive concept. In the nonvolatile memory device according to an embodiment of the present inventive concept, a memory cell array 410 may include magnetic memory cells, and the magnetic memory cells may be divided into a plurality of memory cell groups. For example, FIG. 7 may be a view illustrating a write driver 440 of a nonvolatile memory device corresponding to different memory cell groups. In particular, FIG. 7 may be a circuit diagram of selection circuits 446a, 446b, 446a', and 446b' included in the write driver 440.

Referring to FIG. 7, the write driver 440 included in the nonvolatile memory device according to an embodiment of the present inventive concept may correspond to the write driver 140 of the nonvolatile memory device 100 illustrated in FIG. 4. For example, bit lines and source lines connected to magnetic memory cells included in each of the plurality of memory cell groups may be connected to different column decoders 430 and 430'. Each of the different column decoders 430 and 430' may be connected to the write driver 440 and a sense amplifier circuit SA. For example, the column decoders 430 and 430' may be connected to selection circuits 446a, 446b, 446a', and 446b'.

The write driver 440 may include a first write driver and a second write driver selectively driven according to a resistance corresponding to data to be written to the magnetic memory cell in a write operation. The first write driver and the second write driver may correspond to each other. Hereinafter, the first write driver will be mainly described. In the nonvolatile memory device according to an embodiment of the present inventive concept, the write driver may select a magnetic memory cell to perform a write operation on and input data to the selected magnetic memory cell using the selection circuits 446a and 446a'. In this case, the magnetic memory cells respectively corresponding to the different column decoders 430 and 430' may perform operations individually. For example, one selection circuit 446a may perform a write operation on the corresponding magnetic memory cells, however, the other selection circuit 446a' may not perform a write operation on the corresponding magnetic memory cells.

The nonvolatile memory device according to an embodiment of the present inventive concept may perform a read operation of determining data stored in the magnetic memory cell in advance in order to determine whether to perform a write operation. For example, the write operation and the read operation of the nonvolatile memory device may be controlled by a signal applied from a control logic circuit.

In the write driver 440 of the nonvolatile memory device illustrated in FIG. 7, one selection circuit 446a may perform a write operation on a magnetic memory cell. The control logic circuit may perform a write operation when data stored in the magnetic memory cell is different from data to be written to the magnetic memory cell in a write operation. For example, when a state of a specific magnetic memory cell is different from a state indicated by data to be written in a specific magnetic memory cell, the write driver 440 related to the specific magnetic memory cell may switch the state of the specific magnetic memory cell.

In the nonvolatile memory device according to an embodiment of the present inventive concept, when switching a state of the specific magnetic memory cell, the control logic circuit may turn the switches SW2b and SW2c included in the second switch group in the selection circuit 446a associated with the specific magnetic memory cell on. However, according to the write driver 440 of the nonvolatile memory device illustrated in FIG. 7, one selection circuit 446a' does not perform a write operation on a magnetic memory cell.

The control logic circuit may stop the write operation when data stored in the magnetic memory cell is the same as data to be written to the magnetic memory cell in the write operation. For example, when a state of the specific magnetic memory cell and a state indicated by data to be written to the specific magnetic memory cell are the same, the write driver 440 associated with the specific magnetic memory cell may maintain the state of the specific magnetic memory cell without switching it.

In the nonvolatile memory device according to an embodiment of the present inventive concept, when the data of the specific magnetic memory cell is kept unchanged, the control logic circuit may turn the switches SW2b' and SW2c' included in the second switch group in the selection circuit 446a' associated with the specific magnetic memory cell on. However, in the nonvolatile memory device according to an embodiment of the present inventive concept, the write driver 440, in particular, the selection circuits 446a and 446a', may include a compensation capacitor for compensating for a load caused by a write voltage. The compensation capacitor may be electrically connected to the write driver by compensation switches SWC and SWC'.

The selection circuit 446a' illustrated in FIG. 7 does not perform a write operation on the magnetic memory cell, and in this case, a write voltage may be unstable due to a change in circuit characteristics such as a load. For example, the compensation capacitor included in the nonvolatile memory device according to an embodiment of the present inventive concept may minimize a change in circuit characteristics of the write driver so that the write driver may stably generate a write voltage.

Figure 8:
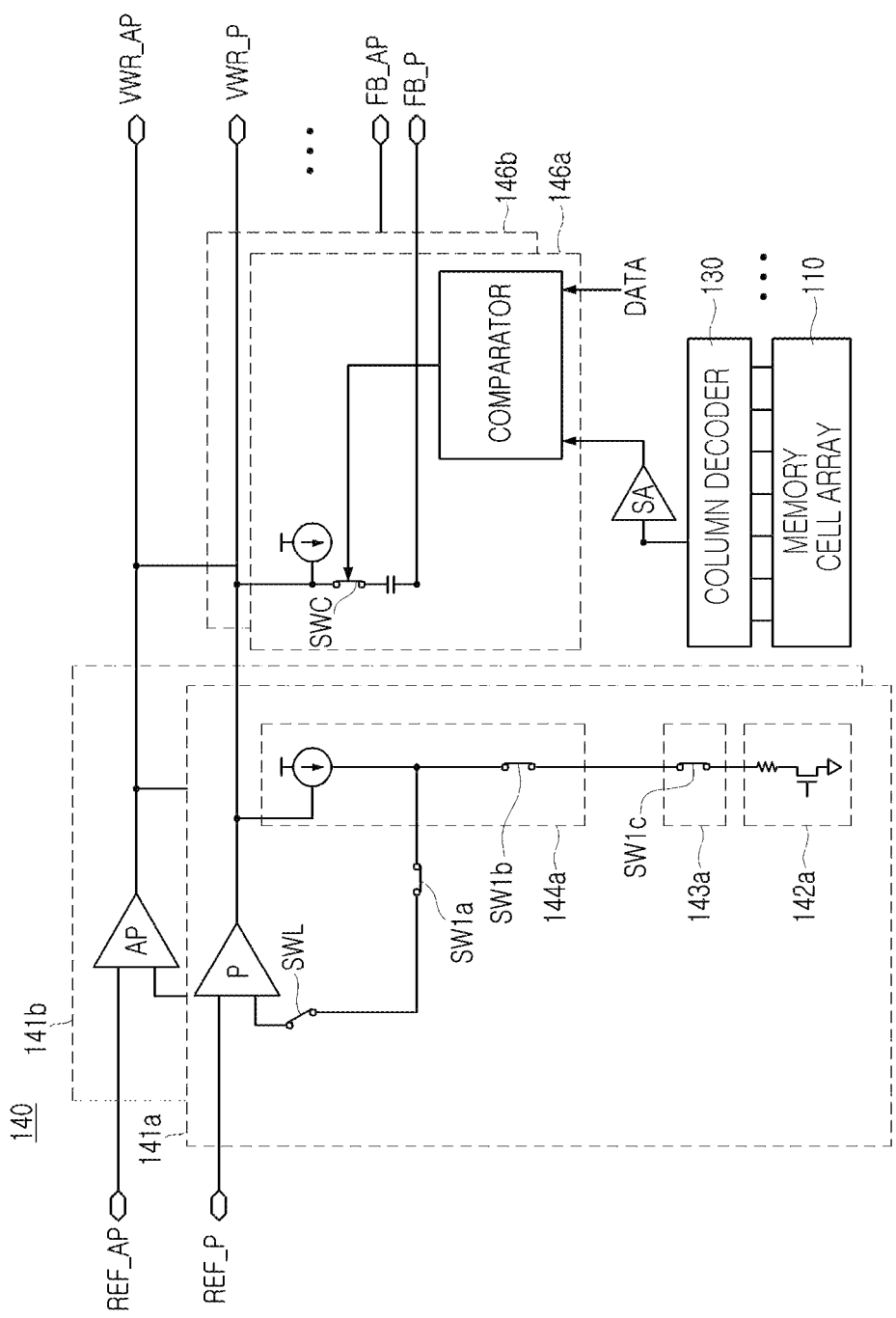
FIGS. 8 and 9 are electrical circuit diagrams illustrating a write operation of a nonvolatile memory device according to an embodiment of the present inventive concept.
Figure 9:
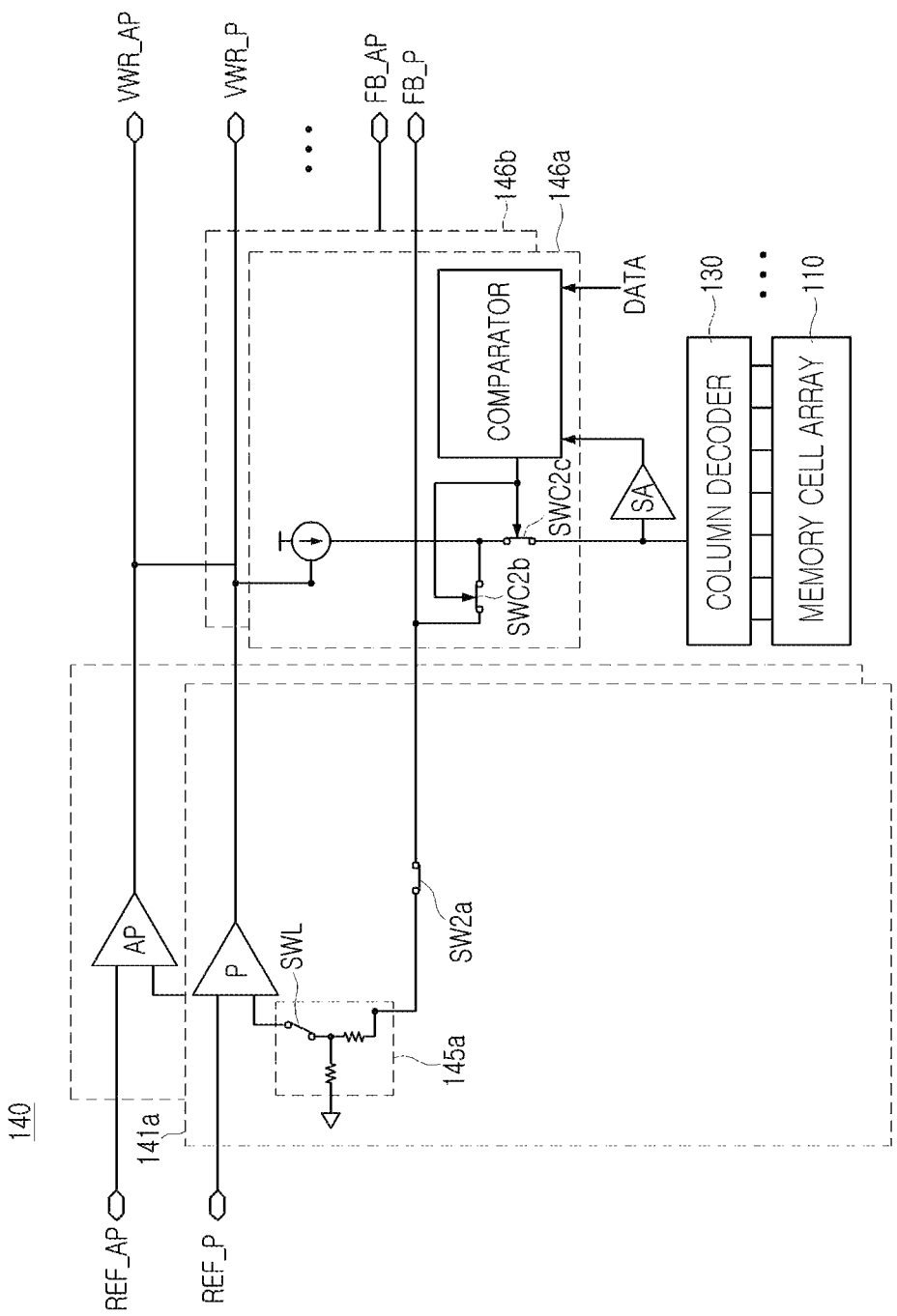

FIGS. 8 and 9 are circuit diagrams illustrating a write operation of a nonvolatile memory device according to an embodiment of the present inventive concept. FIGS. 8 and 9 may be circuit diagrams illustrating a connection relationship according to an operation of the write driver 140 included in the nonvolatile memory device 100 illustrated in FIG. 4. As an example, FIG. 8 may illustrate the write driver 140 when a write operation is not performed, and FIG. 9 may illustrate the write driver 140 when a write operation is performed.

Referring to FIGS. 8 and 9, as described above, first switch group SW1a, SW1b, and SW1c are connected between the replica magnetic memory cell 142a and the voltage divider 145a, and the second switch group SW2a, SW2b, and SW2c may be connected between the magnetic memory cells and the voltage divider 145a. Referring to FIG. 8, when stopping the write operation, the control logic circuit of the nonvolatile memory device 100 may turn the switches included in the first switch group SW1a, SW1b, and SW1c on and turn the switches included in the second switch group SW2a, SW2b, and SW2c off. In addition, the write driver 140 may include a compensation capacitor for compensating for a load change due to the write voltage VWR_P. The control logic circuit may electrically connect the compensation capacitor to the write driver 140 by turning the compensation switch SWC on when stopping the write operation.

Referring to FIG. 9, when performing a write operation, the control logic circuit of the nonvolatile memory device 100 may turn the switches included in the first switch group SW1a, SW1b, and SW1c off and may turn the switches included in the second switch groups SW2a, SW2b, and SW2c on. In addition, the write voltage generating circuit 141a included in the write driver 140 may include the voltage divider 145a for adjusting the feedback voltage FB_P. The control logic circuit may electrically connect the voltage divider 145a to the write driver 140 by turning the level switch SWL on when performing a write operation. In other words, the write voltage generating circuit 141a included in the nonvolatile memory device 100 according to an embodiment of the present inventive concept may generate the write voltage VWR_P based on the feedback voltage FB_P, when performing a write operation. Here, the magnitude of the feedback voltage FB_P may be adjusted by the voltage divider 145a. In addition, the write voltage generating circuit 141a may generate the write voltage VWR_P based on the reference voltage REF_P when the write operation is not performed. In this case, a compensation capacitor may be used to compensate for a load change.

Figure 10:
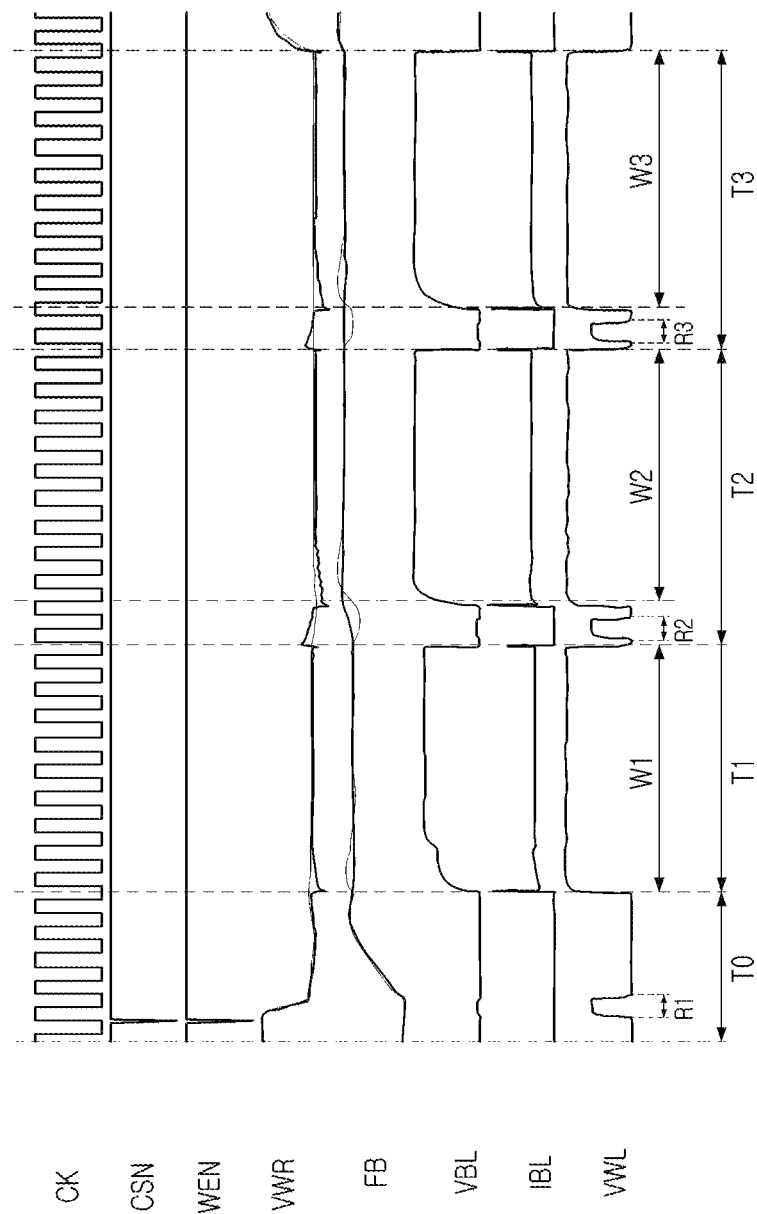
FIG. 10 is a multi-signal timing diagram illustrating a write operation of a nonvolatile memory device according to an embodiment of the present inventive concept.

FIG. 10 is a view illustrating a write operation of a nonvolatile memory device according to an embodiment of the present inventive concept. Referring to FIG. 10, the nonvolatile memory device according to an embodiment of the present inventive concept may determine data recorded in the magnetic memory cell before performing a write operation, and perform feedback based on the determined data to generate a write voltage.

Referring to FIG. 4 together, the nonvolatile memory device 100 according to an embodiment of the present inventive concept may start a write operation according to a clock signal CK, a chip select signal CSN, and a write enable signal WEN. Before the write operation, the write operation generating circuit 141a may not be driven, and may be driven in response to the chip select signal CSN and the write enable signal WEN. A preparation period T0 may be a period in which a write operation is prepared before the first write operation is performed. In the preparation period T0, when the chip select signal CSN and the write enable signal WEN are enabled, the replica write driver 144a may generate a temporary write voltage corresponding to states of the magnetic memory cell. Moreover, the nonvolatile memory device 100 of the present inventive concept may generate a write voltage suitable for performing a write operation by repeating a read operation and a write operation a plurality of times.

The nonvolatile memory device 100 according to an embodiment of the present inventive concept may perform a first read operation during a period R1 within the preparation period T0 for generating a temporary write voltage. The nonvolatile memory device 100 may compare data recorded in the magnetic memory cell determined through the first read operation and data to be recorded through a write operation and determine a memory cell group including magnetic memory cells to perform a write operation and a write voltage feedback. The nonvolatile memory device 100 may perform a first write operation only on a memory cell group including magnetic memory cells in which data determined through the first read operation is different from data to be written through the write operation. The nonvolatile memory device 100 may perform a first write operation during a period W1 within a first period T1.

The nonvolatile memory device 100 may perform a write voltage feedback actually using a voltage of the magnetic memory cell by controlling a switch included in the write driver 140 corresponding to a memory cell group to perform the first write operation on. Through this, the nonvolatile memory device 100 may perform a write operation using a write voltage substantially necessary for the write operation.

After completing the first write operation, the nonvolatile memory device 100 may perform a second read operation during a period R2 within a second period T2. The nonvolatile memory device 100 may determine whether to perform the second write operation based on a result of the second read operation, and then perform the second write operation during a period W2 after a period R2.

The waveform view illustrated in FIG. 10 may illustrate a case in which a read operation and a write operation are performed three times. However, this is merely an example and the present inventive concept may not be limited thereto. For example, when there is no more data to be written to the magnetic memory cell during the read operation and the write operation, the nonvolatile memory device 100 may stop the write operation.

Figure 11:
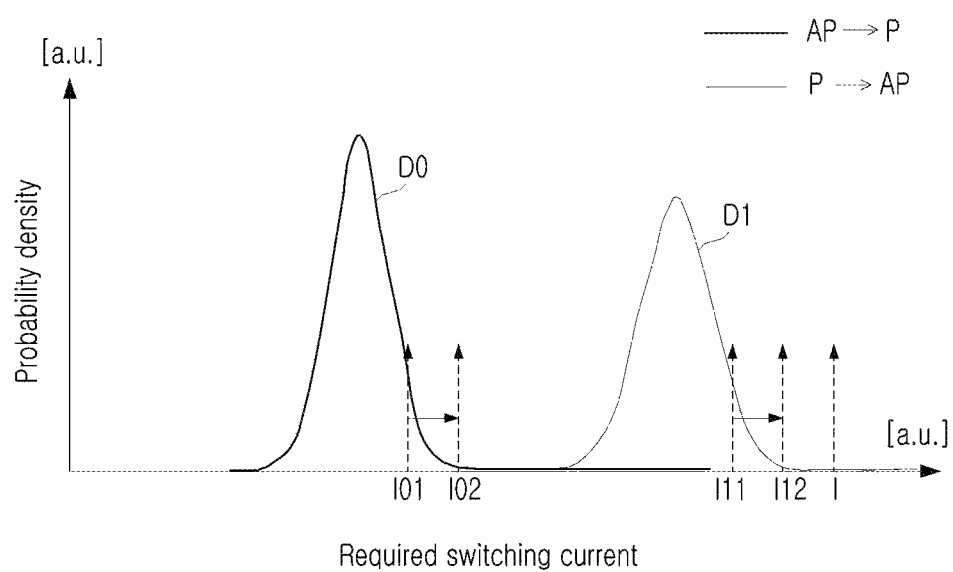
FIG. 11 is a graph illustrating switching current profiles associated with a write operation and effects of a nonvolatile memory device according to an embodiment of the present inventive concept.

FIG. 11 is a view illustrating a write operation and effects of a nonvolatile memory device according to an embodiment of the present inventive concept. FIG. 11 may be a view illustrating a write current required to perform a write operation for inputting data into magnetic memory cells included in the nonvolatile memory device 100 according to an embodiment of the present inventive concept and distribution of magnetic memory cells. Referring also to FIG. 3, a write driver included in a general nonvolatile memory device may use a predetermined write current I considering a margin current IM as a write current, regardless of a state of data to be written to the magnetic memory cell. Accordingly, the write driver may use more than necessary write current even when performing a write operation of changing the state of the magnetic memory cells from the second state AP having high resistance to the first state P having low resistance.

Furthermore, because the write driver 140 included in the nonvolatile memory device 100 according to an embodiment of the present inventive concept uses an individual write voltage generating circuit according to the write data, a write current may be set individually according to the data. Also, the write current for performing the write operation may be adjusted to an appropriate value through feedback of the write voltage. Accordingly, the nonvolatile memory device 100 according to an embodiment of the present inventive concept may reduce stress applied to the magnetic memory cell and reduce energy consumed by a write operation.

As described above, the nonvolatile memory device 100 according to an embodiment of the present inventive concept may repeatedly perform a read operation and a write operation a plurality of times. For example, the first write operation performed for the first time may be performed with first write currents I01 and I11. In addition, magnitudes of the first write currents I01 and I11 may be set to I01 or I11 according to a state of the write data. For example, a first write operation of changing the state of the magnetic memory cells from the second state AP having high resistance to the first state P having low resistance may be performed by a first write current having an intensity of I01, and a first write operation of changing the state of the magnetic memory cells from the first state P having low resistance to the second state AP having high resistance may be performed by a first write current having an intensity of I11 greater than I01.

After the first write operation is completed, a second write operation may be performed on the remaining magnetic memory cells in which writing has not been performed by the first write operation. The second write operation may be performed with second write currents I02 and I12 greater than the first write currents I01 and I11. The second write currents I02 and I12 may be set by feedbacking a write voltage in the remaining magnetic memory cells in which writing has not been performed by the first write operation.

Similarly, the magnitudes of the second write currents I02 and I12 may be set to I02 or I12 according to a state of the write data. For example, a second write operation of changing the state of the magnetic memory cells from the second state AP having high resistance to the first state P having low resistance may be performed by the second write current having an intensity of I02, and a second write operation of changing the state of the magnetic memory cells from the first state P having low resistance to the second state AP having high resistance may be performed by the second write current having an intensity of I12 greater than I02.

The intensity of each of the first write currents I01 and I11 and the second write currents I02 and I12 may be less than the intensity of the predetermined write current I. Accordingly, stress applied to the magnetic memory cell due to the write operation may be minimized and energy consumption of the write operation may be reduced. In addition, since the second write operation is not performed on the magnetic memory cell in which data is already written by the first write operation, stress may not occur on the magnetic memory cell in which writing has already been completed.

Figure 12:
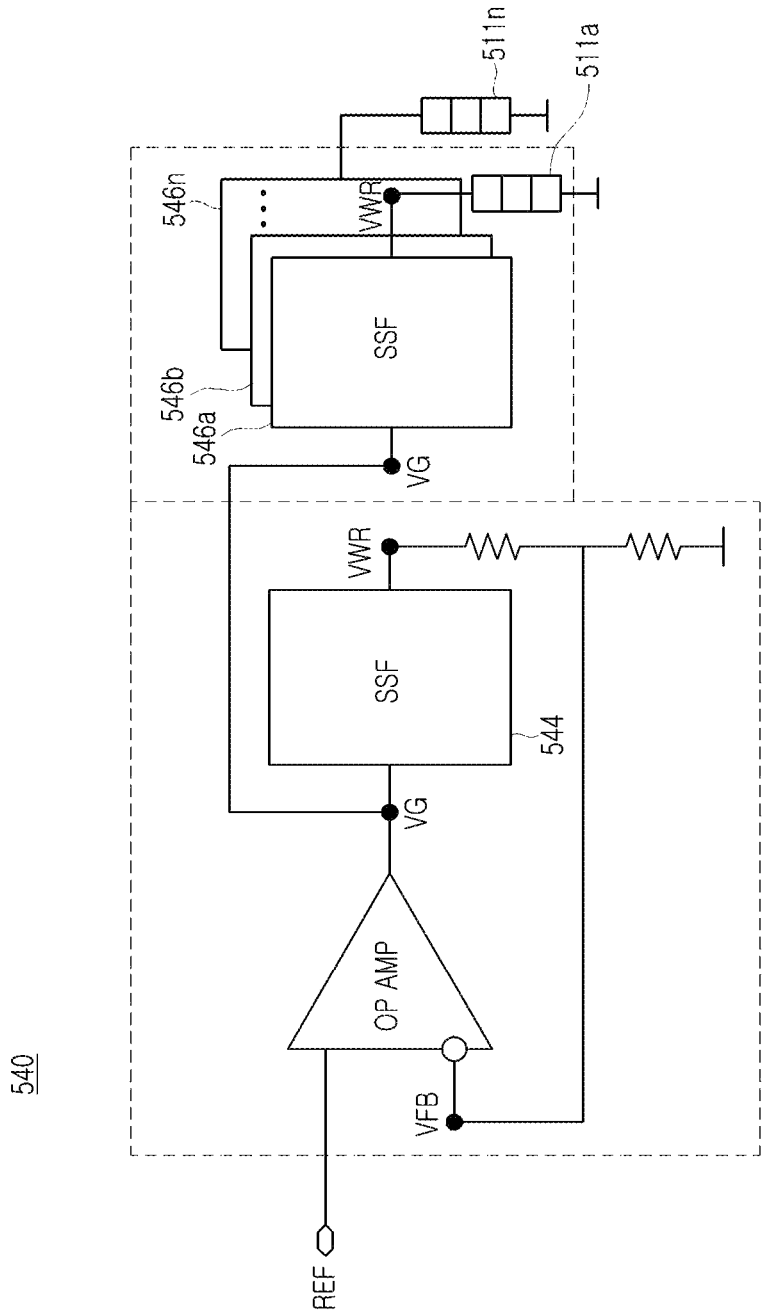
FIG. 12 is an electrical circuit diagram illustrating a write driver of a nonvolatile memory device according to an embodiment of the present inventive concept.

FIG. 12 is a circuit diagram illustrating a write driver of a nonvolatile memory device according to an embodiment of the present inventive concept. The nonvolatile memory device according to an embodiment of the present inventive concept including a write driver 540 illustrated in FIG. 12 may correspond to the nonvolatile memory device 100 illustrated in FIG. 1. For example, the nonvolatile memory device may include a memory cell array, control logic circuit, a row decoder, a column decoder, and a write driver 540.

Similar to the nonvolatile memory device 100 illustrated in FIG. 1, the memory cell array included in the nonvolatile memory device according to an embodiment of the present inventive concept may include magnetic memory cells for storing data. The row decoder may be connected to the memory cell array through word lines and may apply a voltage to the word lines under the control of the control logic circuit. In addition, the column decoder may be connected to the memory cell array through bit lines and source lines and may apply a voltage to the bit lines and the source lines under the control of the control logic circuit.

However, unlike the write driver of the nonvolatile memory device described with reference to FIGS. 4 to 11, the write driver 540 included in the nonvolatile memory device according to an embodiment of the present inventive concept may include a write voltage generating circuit 541 and replica circuits 546a, 546b, . . . , 546n. Also, the write driver 540 included in the nonvolatile memory device according to an embodiment of the present inventive concept may adjust a write voltage using a source follower including a PMOS transistor. In particular, the write driver 540 may include an amplifier having a super source follower (SSF) structure. The amplifier having the SSF structure has a voltage gain close to 1, but has a large input resistance and a low output resistance, so that a received input signal may be output as an output signal with little loss.

The write voltage generating circuit 541 may generate a write voltage VWR for performing a write operation based on a reference voltage REF generated using the replica magnetic memory cell and a compensation voltage VFB generated using the compensation circuit 544 operating as a super source follower SSF. The magnitude of the write voltage VWR may be proportional to the magnitude of the reference voltage REF. During a write operation, the write driver 540 may transfer the generated write voltage VWR to a selected bit line through the column decoder.

As shown in FIG. 12, in the write driver 540, the replica magnetic memory cell may operate as a variable resistor, and the replica circuits 546a, 546b, . . . , 546n may be respectively connected to the plurality of memory cell groups 511a, . . . , 511n including magnetic memory cells. Each of the replica circuits 546a, 546b, . . . , 546n may include an amplifier having the same super source follower (SSF) structure as that of the compensation circuit 544. For example, the replica circuits 546a, 546b, . . . , 546n may share a gate voltage VG with the compensation circuit 544. In other words, the input of the replica circuits 546a, 546b, . . . , 546n and the compensation circuit 544 may be the gate voltage VG, and the output may be the write voltage VWR.

Figure 13:
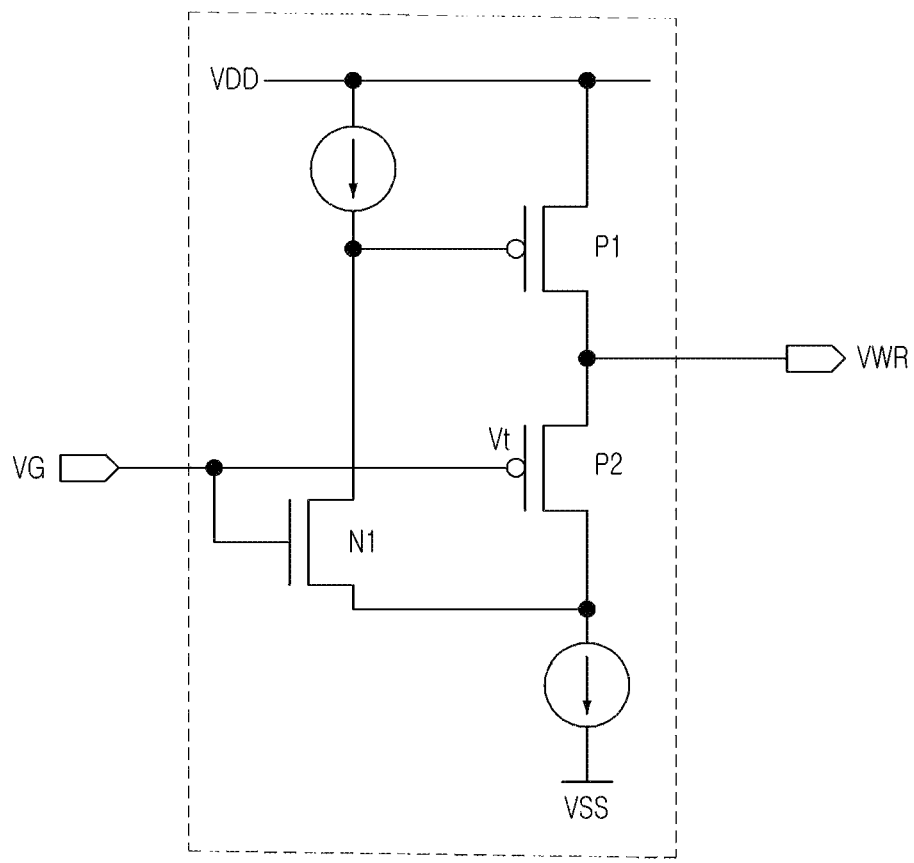
FIG. 13 is an electrical circuit diagram illustrating a compensation circuit of a nonvolatile memory device according to an embodiment of the present inventive concept.

FIG. 13 is a circuit diagram illustrating a compensation circuit of a nonvolatile memory device according to an embodiment of the present inventive concept. Referring to FIG. 13, the compensation circuit 544 included in the write driver 540 of the nonvolatile memory device according to an embodiment of the present inventive concept may include an amplifier having a super source follower (SSF) structure.

For example, the compensation circuit 544 may include a first PMOS transistor P1 and a second PMOS transistor P2 connected in series. Also, the compensation circuit 544 may include a first NMOS transistor N1 sharing the gate voltage VG with the second PMOS transistor P2. In the nonvolatile memory device according to an embodiment of the present inventive concept, each of electrodes of the first NMOS transistor N1 may be connected to an electrode of the second PMOS transistor P2 and a gate electrode of the first PMOS transistor P1.

However, this is only an embodiment and the present inventive concept is not limited thereto, and the compensation circuit 544 may further include other elements as necessary. For example, the compensation circuit 544 may further include an output driver configured of a PMOS transistor, a common-gate amplifier, and the like. The compensation circuit 544 may output the sum of the gate voltage VG for performing the write operation and a threshold voltage Vt of the second PMOS transistor as a compensation voltage. For example, the compensation voltage may be a write voltage VWR for performing a write operation.

Figure 14:
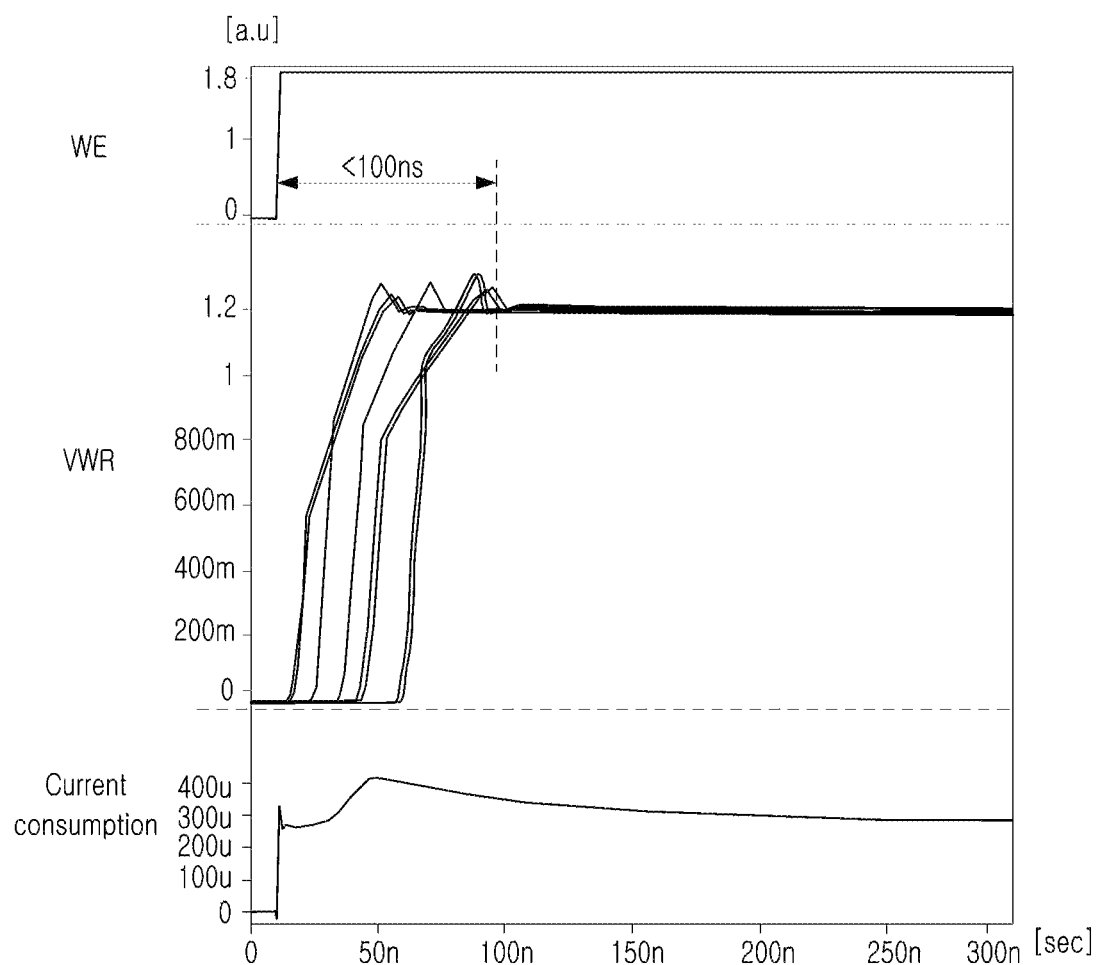
FIGS. 14 and 15 are graphs illustrating effects of a nonvolatile memory device according to an embodiment of the present inventive concept.
Figure 15:
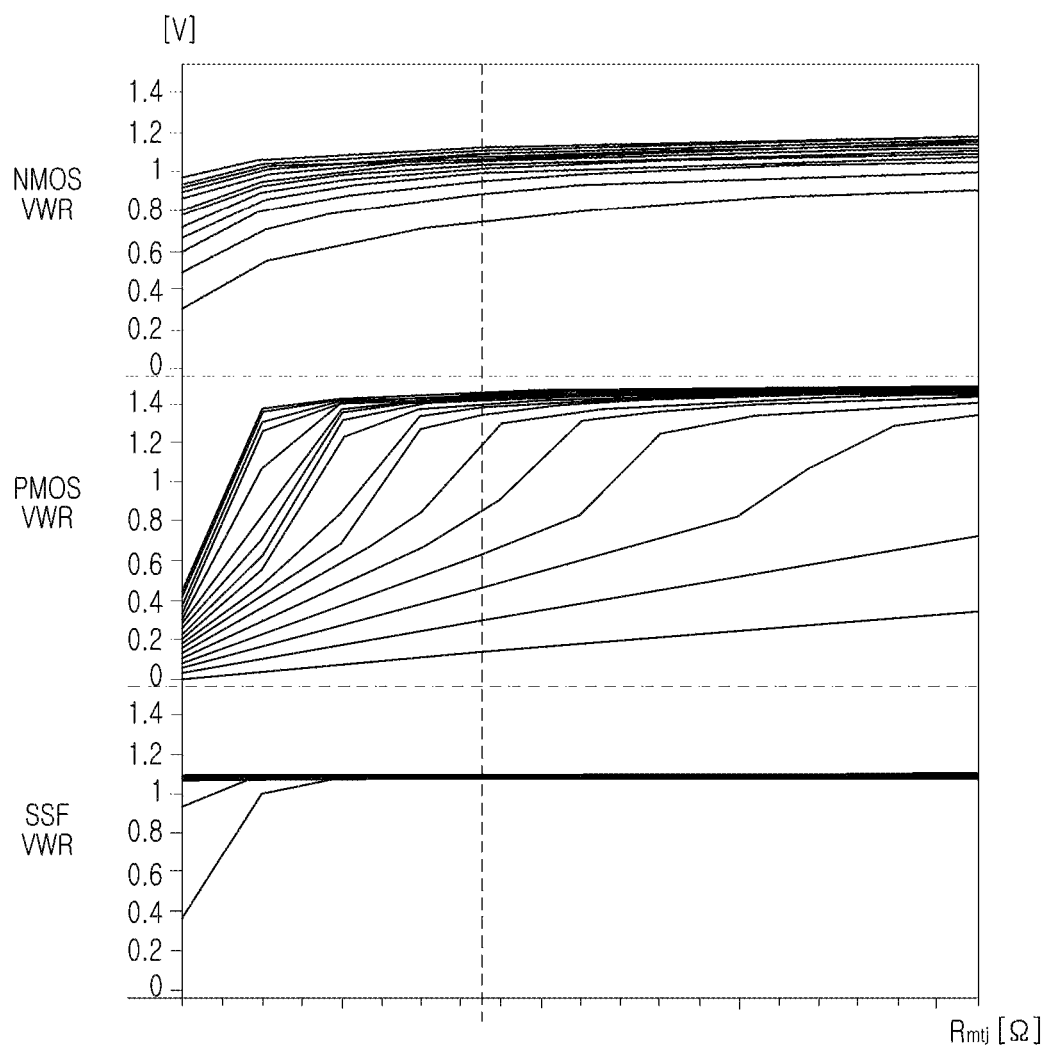

FIGS. 14 and 15 are views illustrating an effect of a nonvolatile memory device according to an embodiment of the present inventive concept. The write operation in the nonvolatile memory device illustrated in FIG. 12 may be performed similarly to the write operation in the nonvolatile memory device described above with reference to FIGS. 4 to 11. However, referring to FIGS. 14 and 15, a change in signal in the nonvolatile memory device including the compensation circuit 544 operating as a super source follower (SSF) during a write operation and the replica circuits 546a, 546b, . . . , 546n may be different from a change in signal in the nonvolatile memory device using an NMOS driver or a PMOS driver as a write driver. The nonvolatile memory device using an NMOS driver as a write driver may require a charge pump circuit. Charge pumps may be implemented in a complicated form, may generate high stress voltages, and require a quiescent current to keep the charge pump active. Also, in the nonvolatile memory device using an NMOS driver, a write voltage used for a write operation may be sensitively changed according to a state of a magnetic memory cell. In order to reduce such sensitivity, output impedance of the NMOS driver needs to be reduced, and thus, the NMOS driver needs to be designed to be large.

In addition, referring to FIG. 10, the nonvolatile memory device 100 using a PMOS driver as a write driver has a relatively high voltage gain, so it may be difficult to control a write voltage, and it may take a substantial amount of time for a feedback process of the write voltage. Also, in the nonvolatile memory device 100 using the PMOS driver, the reference voltage is set to be different depending on a write data state, and thus, the write operation may fail.

FIGS. 14 and 15 may be views illustrating relative effects of a nonvolatile memory device according to an embodiment of the present inventive concept. As an example, FIGS. 14 and 15 may include results observed under various temperature conditions and various pressure conditions. However, the graphs illustrated in FIGS. 14 and 15 are merely exemplary and may not be limited.

Referring to FIG. 14, the nonvolatile memory device according to an embodiment of the present inventive concept may generate the write voltage VWR when the write enable signal WE is enabled. The write voltage VWR appropriate for the state of the magnetic memory cell may be generated within about 100 ns, irrespective of temperature and pressure conditions. Accordingly, compared with the nonvolatile memory device of the related art, an appropriate write voltage VWR may be quickly generated by consuming relatively little energy. Advantageously, the nonvolatile memory device according to an embodiment of the present inventive concept may omit a charge pump that requires a quiescent current as compared to a nonvolatile memory device using an NMOS driver as a write driver. Thus, the nonvolatile memory device according to an embodiment of the present disclosure may be relatively simple and small and may not generate a stress voltage. In addition, compared with the nonvolatile memory device using the PMOS driver as a write driver, the write voltage may be relatively stably adjusted as compared to a nonvolatile memory device using a PMOS driver as a write driver.

Referring to FIG. 15, since the nonvolatile memory device according to an embodiment of the present inventive concept has a low output impedance, a write voltage used for a write operation may not change sensitively to the data written in the magnetic memory cell, that is, a resistance of the magnetic memory cell. For example, in a nonvolatile memory device using an NMOS driver or a PMOS driver as a write driver, a write voltage generated according to a resistance of a magnetic memory cell may change. Also, a range of the generated write voltage may vary depending on temperature and pressure conditions.

In addition, the nonvolatile memory device according to an embodiment of the present inventive concept may generate the same write voltage VWR even if the resistances of the magnetic memory cells are different. According to FIG. 15, the write voltage generated according to the resistance of the magnetic memory cell may change under a specific temperature condition and pressure condition, but the nonvolatile memory device according to an embodiment of the present inventive concept may generate a write voltage relatively stably, compared with other nonvolatile memory devices.

Figure 16:
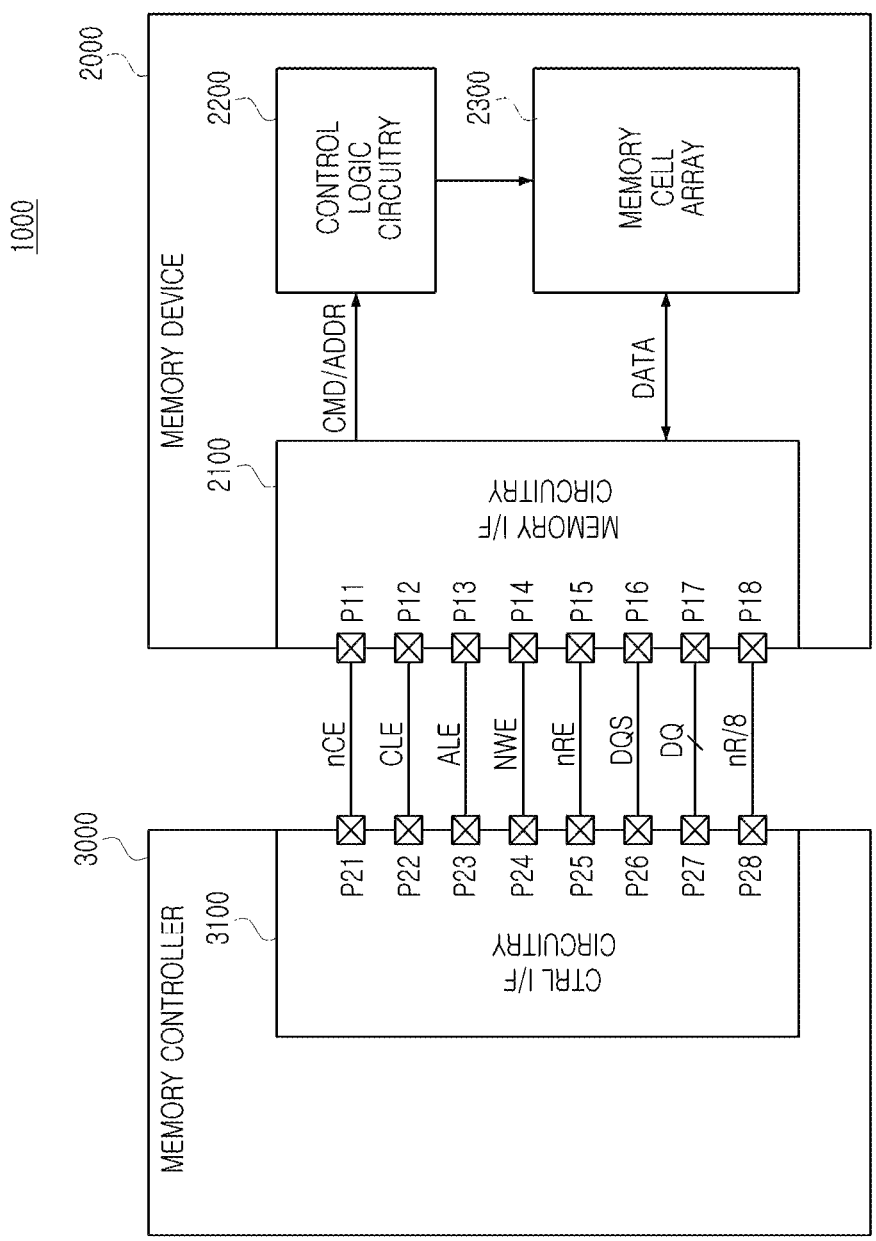
FIG. 16 is a block diagram illustrating a memory system including a nonvolatile memory device according to an embodiment of the present inventive concept.

FIG. 16 is a schematic block diagram illustrating a memory system including a nonvolatile memory device according to an embodiment of the present inventive concept. Referring to FIG. 16, the memory system 1000 may include a memory device 2000 and a memory controller 3000. The memory device 2000 may correspond to one of nonvolatile memory devices communicating with the memory controller 3000. The memory device 2000 may correspond to the nonvolatile memory device 100 according to an embodiment of the present inventive concept illustrated in FIG. 1 and may include first to eighth pins P11 to P18, a memory interface (I/F) circuit (or circuitry) 2100, a control logic circuit (or circuitry) 2200, and a memory cell array 2300.

The memory interface circuit 2100 may receive a chip enable signal nCE from the memory controller 3000 through the first pin P11. The memory interface circuit 2100 may transmit/receive signals to and from the memory controller 3000 through the second to eighth pins P12 to P18 according to the chip enable signal nCE. For example, when the chip enable signal nCE is enabled (e.g., a low level), the memory interface circuit 2100 may transmit and receive signals to and from the memory controller 3000 through the second to eighth pins P12 to P18.

The memory interface circuit 2100 may receive a command latch enable signal CLE, an address latch enable signal ALE, and a write enable signal nWE from the memory controller 3000 through the second to fourth pins P12 to P14. The memory interface circuit 2100 may receive a data signal DQ from the memory controller 3000 through the seventh pin P17 or transmit the data signal DQ to the memory controller 3000. A command CMD, an address ADDR, and data may be transmitted through the data signal DQ. For example, the data signal DQ may be transmitted through a plurality of data signal lines. In this case, the seventh pin P17 may include a plurality of pins corresponding to the plurality of data signals DQ.

The memory interface circuit 2100 may obtain the command CMD from the data signal DQ received in an enable period (e.g., high level state) of a command latch enable signal CLE based on toggle timings of the write enable signal nWE. The memory interface circuit 2100 may acquire the address ADDR from the data signal DQ received in an enable period (e.g., high level state) of the address latch enable signal ALE based on the toggle timings of the write enable signal nWE.

In an example embodiment, the write enable signal nWE is maintained in a static state (e.g., a high level or a low level) and toggled between the high level and the low level. For example, the write enable signal nWE may be toggled during a period in which the command CMD or the address ADDR is transmitted. Accordingly, the memory interface circuit 310 may acquire the command CMD or the address ADDR based on the toggle timings of the write enable signal nWE.

The memory interface circuit 2100 may receive a read enable signal nRE from the memory controller 3000 through the fifth pin P15. The memory interface circuit 310 may receive a data strobe signal DQS from the memory controller 400 through the sixth pin P16 or transmit the data strobe signal DQS to the memory controller 3000.

When the data signal DQ including data is received from the memory controller 3000 in a data input operation of the memory device 2000, the memory interface circuit 2100 may receive the data strobe signal DQS toggled with the data from the memory controller 3000. The memory interface circuit 2100 may acquire the data from the data signal DQ based on a toggle timing of the data strobe signal DQS. For example, the memory interface circuit 2100 may acquire the data DATA by sampling the data signal DQ at a rising edge and a falling edge of the data strobe signal DQS.

The memory interface circuit 2100 may transmit a ready/busy output signal nR/B to the memory controller 3000 through the eighth pin P18. The memory interface circuit 2100 may transmit state information of the memory device 2000 to the memory controller 3000 through the ready/busy output signal nR/B. When the memory device 2000 is in a busy state (i.e., when internal operations of the memory device 2000 are being performed), the memory interface circuit 2100 may transmit the ready/busy output signal nR/B indicating a busy state to the memory controller 3000. When the memory device 2000 is in the ready state (that is, when internal operations of the memory device 2000 are not performed or completed), the memory interface circuit 2100 may transmit the ready/busy output signal nR/B indicating the ready state to the memory controller 3000. For example, while the memory device 2000 reads data DATA from the memory cell array 2300 in response to a page read command, the memory interface circuit 2100 may transmit the ready/busy output signal nR/B indicating a busy state (e.g., low level) to the memory controller 3000. For example, while the memory device 2000 performs a data write operation to the memory cell array 2300 in response to a write command, the memory interface circuit 2100 may transmit the ready/busy output signal nR/B indicating a busy state to the memory controller 3000.

The control logic circuit 320 may generally control various operations of the memory device 2000. The control logic circuit 2200 may receive the command/address CMD/ADDR acquired from the memory interface circuit 2100. The control logic circuit 2200 may generate control signals for controlling other components of the memory device 2000 according to the received command/address CMD/ADDR. For example, the control logic circuit 2200 may generate various control signals for programming data DATA in the memory cell array 2300 or reading data DATA from the memory cell array 2300.

The memory cell array 2300 may store the data DATA acquired from the memory interface circuit 2100 under the control of the control logic circuit 2200. The memory cell array 2300 may output the stored data DATA to the memory interface circuit 2100 under the control of the control logic circuit 2200.

The memory cell array 2300 may include a plurality of memory cells. For example, the plurality of memory cells may be magnetic random access memory (MRAM) cells. However, the present inventive concept is not limited thereto, and the memory cells may include flash memory cells, resistive random access memory (RRAM) cells, ferroelectric random access memory (FRAM) cells, phase change random access memory (PRAM) cells, and thyristor random access memory (TRAM) cells.

The memory controller 3000 may include first to eighth pins P21 to P28 and a controller interface (I/F) circuit 3100. The first to eighth pins P21 to P28 may correspond to the first to eighth pins P11 to P18 of the memory device 2000.

The controller interface circuit 3100 may transmit a chip enable signal nCE to the memory device 2000 through the first pin P21. The controller interface circuit 3100 may transmit/receive signals to and from the memory device 2000 selected based on the chip enable signal nCE through the second to eighth pins P22 to P28.

The controller interface circuit 3100 may transmit a command latch enable signal CLE, an address latch enable signal ALE, and a write enable signal nWE to the memory device 2000 through the second to fourth pins P22 to P24. The controller interface circuit 3100 may transmit the data signal DQ to the memory device 2000 or receive the data signal DQ from the memory device 2000 through the seventh pin P27.

The controller interface circuit 3100 may transmit the data signal DQ including the command CMD or the address ADDR together with the toggling write enable signal nWE to the memory device 2000. The controller interface circuit 3100 may transmit the data signal DQ including the command CMD to the memory device 2000 as the command latch enable signal CLE having an enable state is transmitted, and may transmit the data signal DQ including the address ADDR to the memory device 2000 as the address latch enable signal ALE having an enable state is transmitted.

The controller interface circuit 3100 may transmit the read enable signal nRE to the memory device 2000 through the fifth pin P25. The controller interface circuit 3100 may receive the data strobe signal DQS from the memory device 2000 through the sixth pin P26 or transmit the data strobe signal DQS to the memory device 2000.

In the data DATA output operation of the memory device 2000, the controller interface circuit 3100 may generate a toggling read enable signal nRE and transmit the read enable signal nRE to the memory device 2000. For example, the controller interface circuit 3100 may generate the read enable signal nRE changed from a static state (e.g., a high level or a low level) to a toggle state before the data DATA is output. Accordingly, the data strobe signal DQS toggling based on the read enable signal nRE may be generated in the memory device 2000. The controller interface circuit 3100 may receive the data signal DQ including the data DATA together with the toggling data strobe signal DQS from the memory device 2000. The controller interface circuit 3100 may acquire the data DATA from the data signal DQ based on the toggle timing of the data strobe signal DQS.

In a data DATA input operation of the memory device 2000, the controller interface circuit 3100 may generate the toggling data strobe signal DQS. For example, the controller interface circuit 3100 may generate the data strobe signal DQS changed from a static state (e.g., a high level or a low level) to a toggle state before transmitting the data DATA. The controller interface circuit 3100 may transmit the data signal DQ including the data DATA to the memory device 2000 based on the toggle timings of the data strobe signal DQS. The controller interface circuit 3100 may receive the ready/busy output signal nR/B from the memory device 2000 through the eighth pin P28. The controller interface circuit 3100 may determine state information of the memory device 2000 based on the ready/busy output signal nR/B.

As set forth above, the nonvolatile memory device according to an embodiment of the present inventive concept may generate a feedback voltage using a magnetic memory cell on which a write operation is performed, adjust a magnitude of the feedback voltage using a voltage divider, and output a compensated write voltage based thereon, thereby stably adjusting a write voltage.

The nonvolatile memory device according to an embodiment of the present inventive concept may stably adjust the write voltage using a compensation circuit including a PMOS transistor and operating as a source follower.

The nonvolatile memory device according to an embodiment of the present inventive concept may prevent deterioration of an MTJ device and stably perform a write operation by stably adjusting the write voltage.

While example embodiments have been illustrated and described above, it will be apparent to those skilled in the art that modifications and variations could be made without departing from the scope of the present inventive concept as defined by the appended claims.

What is claimed is:

1. A nonvolatile memory device, comprising:
   an array of magnetic memory cells;
   a control logic circuit having a voltage generator therein, which is configured to generate a gate voltage;
   a row decoder connected by word lines to the array of magnetic memory cells, and having a word line driver driven therein, which is responsive to the gate voltage;
   a column decoder connected by bit lines and source lines to the array of magnetic memory cells; and
   a write driver having a write voltage generating circuit therein, which is configured to output a write voltage, in response to: (i) a reference voltage generated using a replica magnetic memory cell, and (ii) a feedback voltage generated using a magnetic memory cell in which a write operation is to be performed, said write voltage generating circuit comprising a voltage divider configured to adjust a size of the feedback voltage using a level switch, and said write driver configured to transfer the write voltage to a bit line selected by the column decoder during the write operation.

2. The nonvolatile memory device of claim 1, wherein the array of magnetic memory cells is divided into a plurality of memory cell groups; and wherein the write driver comprises a selecting circuit, which is configured to selectively record data in the magnetic memory cells included in each of the plurality of memory cell groups.

3. The nonvolatile memory device of claim 2, wherein each of the plurality of memory cell groups is connected to two write drivers; and wherein the two write drivers are selectively driven according to a resistance corresponding to data to be written into the magnetic memory cell by the write operation.

4. The nonvolatile memory device of claim 1, wherein a first switch group is connected between the replica magnetic memory cell and the voltage divider; and wherein a second switch group is connected between the magnetic memory cells and the voltage divider.

5. The nonvolatile memory device of claim 4, wherein, when performing the write operation, the control logic circuit is configured to turn switches included in the first switch group off and configured to turn switches included in the second switch group on.

6. The nonvolatile memory device of claim 4, wherein, when stopping the write operation, the control logic circuit is configured to turn switches included in the first switch group on and configured to turn switches included in the second switch group off.

7. The nonvolatile memory device of claim 6, wherein the write driver is electrically connected to a compensation capacitor by a compensation switch; and wherein the control logic circuit is configured to turn the compensation switch on when stopping the write operation.

8. The nonvolatile memory device of claim 1, wherein the control logic circuit is configured to perform a read operation to determine data stored in the magnetic memory cell, during, but prior to completion of, the write operation.

9. The nonvolatile memory device of claim 8, wherein the control logic circuit is configured to terminate the write operation when the data stored in the magnetic memory cell is the same as data to be written in the magnetic memory cell according to the write operation.

10. The nonvolatile memory device of claim 8, wherein the control logic circuit is configured to perform the write operation when the data stored in the magnetic memory cell is different from data to be written into the magnetic memory cell according to the write operation.

11. The nonvolatile memory device of claim 1, wherein the control logic circuit is configured to change the write voltage, in response to feedback; and wherein the control logic circuit is further configured to perform the write operation using the changed write voltage.

12. A nonvolatile memory device, comprising:
an array of magnetic memory cells;
a control logic circuit having a voltage generator therein, which is configured to generate a gate voltage, said control logic circuit configured to determine data stored in the magnetic memory cells upon commencement of a write operation and thereafter perform the write operation when the data stored in the magnetic memory cells is different from the data to be written to the magnetic memory cell during the write operation;
a row decoder comprising a word line driver, which is driven by the gate voltage and connected to the array of magnetic memory cells by word lines;
a column decoder connected to the array of magnetic memory cells by bit lines and source lines; and
a write driver having a write voltage generating circuit therein, said write driver configured to transmit a write voltage to a bit line selected by the column decoder when performing a write operation; and
wherein the write voltage generating circuit is configured to generate the write voltage based on: (i) a reference voltage generated using a replica magnetic memory cell, and (ii) a feedback voltage generated using a magnetic memory cell in which the write operation is to be performed.

13. The nonvolatile memory device of claim 12, wherein the write voltage generating circuit is configured to generate a write voltage based on the feedback voltage when the write operation is to be performed, and is configured to generate a write voltage based on the reference voltage when the write operation is not to be performed.

14. The nonvolatile memory device of claim 12, wherein the write driver includes a compensation capacitor for compensating a load based on the write voltage; and wherein the compensation capacitor is electrically connected to the write driver by a compensation switch.

15. The nonvolatile memory device of claim 14, wherein the control logic is configured to turn the compensation switch, included in the write driver stopped during the write operation, on.

16. A nonvolatile memory device, comprising:
an array of magnetic memory cells having a plurality of memory cell groups therein;
a control logic circuit comprising a voltage generator, which is configured to generate a gate voltage;
a row decoder having a word line driver therein, which is driven by the gate voltage and connected to the memory cell array through word lines;
a column decoder connected to the memory cell array through bit lines and source lines; and
a write driver having a write voltage generating circuit therein, which is configured to output: (i) a write voltage proportional to a reference voltage generated using a replica magnetic memory cell based on the reference voltage, and (ii) a compensation voltage generated using a compensation circuit operating as a source follower including a PMOS transistor, and transmit the write voltage to a bit line selected by the column decoder when performing a write operation.

17. The nonvolatile memory device of claim 16, wherein the write driver includes a replica circuit connected to each of the plurality of memory cell groups; and wherein the replica circuit shares a gate voltage with the compensation circuit.

18. The nonvolatile memory device of claim 16, wherein the compensation circuit includes first and second PMOS transistors connected in series, and a first NMOS transistor that shares a gate voltage with the second PMOS transistor.

19. The nonvolatile memory device of claim 18, wherein a drain electrode of the first NMOS transistor is connected to a gate electrode of the first PMOS transistor and a source electrode of the first NMOS transistor is connected to a source of the second PMOS transistor.

20. The nonvolatile memory device of claim 16, wherein the compensation circuit outputs, as the compensation voltage, a sum of a gate voltage for performing the write operation and a threshold voltage of the PMOS transistor.

* * * * *